(12) United States Patent
Lung et al.

(10) Patent No.: US 7,551,473 B2
(45) Date of Patent: Jun. 23, 2009

(54) PROGRAMMABLE RESISTIVE MEMORY WITH DIODE STRUCTURE

(75) Inventors: Hsiang-Lan Lung, Elmsford, NY (US); Chung Hon Lam, Peekskill, NY (US); Matthew J. Breitwisch, Yorktown Heights, NY (US)

(73) Assignee: Macronix International Co., Ltd., Hsinchu (TW)

( * ) Notice: Subject to any disclaimer, the term of this patent is extended or adjusted under 35 U.S.C. 154(b) by 73 days.

(21) Appl. No.: 11/871,813

(22) Filed: Oct. 12, 2007

(65) Prior Publication Data

US 2009/0095948 A1    Apr. 16, 2009

(51) Int. Cl.
*G11C 11/00* (2006.01)

(52) U.S. Cl. ............... 365/148; 257/2; 257/4; 257/5; 257/8; 438/102

(58) Field of Classification Search ............ 365/148; 257/2, 4, 5, 8; 438/102
See application file for complete search history.

(56) References Cited

U.S. PATENT DOCUMENTS

| | | | |
|---|---|---|---|
| 3,271,591 A | 9/1966 | Ovshinsky | |
| 3,530,441 A | 9/1970 | Ovshinsky | |
| 4,599,705 A | 7/1986 | Holmberg et al. | |
| 4,719,594 A | 1/1988 | Young et al. | |
| 4,876,220 A | 10/1989 | Mohsen et al. | |
| 4,959,812 A | 9/1990 | Momodomi et al. | |
| 5,166,096 A | 11/1992 | Cote et al. | |
| 5,166,758 A | 11/1992 | Ovshinsky et al. | |
| 5,177,567 A | 1/1993 | Klersy et al. | |
| 5,515,488 A | 5/1996 | Stephens, Jr. | |
| 5,534,712 A | 7/1996 | Ovshinsky et al. | |
| 5,687,112 A | 11/1997 | Ovshinsky | |
| 5,789,277 A | 8/1998 | Zahorik et al. | |
| 5,789,758 A | 8/1998 | Reinberg | |
| 5,814,527 A | 9/1998 | Wolstenholme et al. | |
| 5,831,276 A | 11/1998 | Gonzalez et al. | |
| 5,837,564 A | 11/1998 | Sandhu et al. | |
| 5,869,843 A | 2/1999 | Harshfield | |
| 5,879,955 A | 3/1999 | Gonzalez et al. | |
| 5,920,788 A | 7/1999 | Reinberg | |
| 5,952,671 A | 9/1999 | Reinberg et al. | |
| 5,958,358 A | 9/1999 | Tenne et al. | |
| 5,970,336 A | 10/1999 | Wolstenholme et al. | |
| 5,985,698 A | 11/1999 | Gonzalez et al. | |

(Continued)

FOREIGN PATENT DOCUMENTS

WO          00/79539          12/2000

(Continued)

OTHER PUBLICATIONS

Alder, David, "Amorphous-Semiconductor Devices," Sci. Amer., vol. 236, pp. 36-48, May 1977.

(Continued)

*Primary Examiner*—Evan Pert
*Assistant Examiner*—Tan N Tran
(74) *Attorney, Agent, or Firm*—Kenta Suzue; Haynes Beffel & Wolfeld LLP

(57) ABSTRACT

Programmable resistive memory cells are accessed by semiconductor diode structures. Manufacturing methods and integrated circuits for programmable resistive elements with such diode structures are also disclosed.

25 Claims, 13 Drawing Sheets

U.S. PATENT DOCUMENTS

| | | |
|---|---|---|
| 5,998,244 A | 12/1999 | Wolstenholme et al. |
| 6,011,725 A | 1/2000 | Eitan et al. |
| 6,025,220 A | 2/2000 | Sandhu |
| 6,031,287 A | 2/2000 | Harshfield |
| 6,034,882 A | 3/2000 | Johnson et al. |
| 6,077,674 A | 6/2000 | Schleifer et al. |
| 6,077,729 A | 6/2000 | Harshfield |
| 6,087,674 A | 7/2000 | Ovshinsky et al. |
| 6,104,038 A | 8/2000 | Gonzalez et al. |
| 6,111,264 A | 8/2000 | Wolstenholme et al. |
| 6,114,713 A | 9/2000 | Zahorik |
| 6,117,720 A | 9/2000 | Harshfield |
| 6,147,395 A | 11/2000 | Gilgen |
| 6,150,253 A | 11/2000 | Doan et al. |
| 6,153,890 A | 11/2000 | Wolstenholme et al. |
| 6,177,317 B1 | 1/2001 | Huang et al. |
| 6,185,122 B1 | 2/2001 | Johnson et al. |
| 6,189,582 B1 | 2/2001 | Reinberg et al. |
| 6,236,059 B1 | 5/2001 | Wolstenholme et al. |
| RE37,259 E | 7/2001 | Ovshinsky |
| 6,271,090 B1 | 8/2001 | Huang et al. |
| 6,280,684 B1 | 8/2001 | Yamada et al. |
| 6,287,887 B1 | 9/2001 | Gilgen |
| 6,314,014 B1 | 11/2001 | Lowrey et al. |
| 6,320,786 B1 | 11/2001 | Chang et al. |
| 6,339,544 B1 | 1/2002 | Chiang et al. |
| 6,351,406 B1 | 2/2002 | Johnson et al. |
| 6,420,215 B1 | 7/2002 | Knall et al. |
| 6,420,216 B1 | 7/2002 | Clevenger et al. |
| 6,420,725 B1 | 7/2002 | Harshfield |
| 6,423,621 B2 | 7/2002 | Doan et al. |
| 6,429,064 B1 | 8/2002 | Wicker |
| 6,462,353 B1 | 10/2002 | Gilgen |
| 6,483,736 B2 | 11/2002 | Johnson et al. |
| 6,487,114 B2 | 11/2002 | Jong et al. |
| 6,501,111 B1 | 12/2002 | Lowrey |
| 6,511,867 B2 | 1/2003 | Lowrey et al. |
| 6,512,241 B1 | 1/2003 | Lai |
| 6,514,788 B2 | 2/2003 | Quinn |
| 6,534,781 B2 | 3/2003 | Dennison |
| 6,545,903 B1 | 4/2003 | Wu |
| 6,555,860 B2 | 4/2003 | Lowrey et al. |
| 6,563,156 B2 | 5/2003 | Harshfield |
| 6,566,700 B2 | 5/2003 | Xu |
| 6,567,293 B1 | 5/2003 | Lowrey et al. |
| 6,579,760 B1 | 6/2003 | Lung et al. |
| 6,586,761 B2 | 7/2003 | Lowrey |
| 6,589,714 B2 | 7/2003 | Maimon et al. |
| 6,593,176 B2 | 7/2003 | Dennison |
| 6,597,009 B2 | 7/2003 | Wicker |
| 6,605,527 B2 | 8/2003 | Dennison et al. |
| 6,605,821 B1 | 8/2003 | Lee et al. |
| 6,607,974 B2 | 8/2003 | Harshfield |
| 6,613,604 B2 | 9/2003 | Maimon et al. |
| 6,617,192 B1 | 9/2003 | Lowrey et al. |
| 6,621,095 B2 | 9/2003 | Chiang et al. |
| 6,627,530 B2 | 9/2003 | Li et al. |
| 6,639,849 B2 | 10/2003 | Takahashi et al. |
| 6,673,700 B2 | 1/2004 | Dennison et al. |
| 6,744,088 B1 | 6/2004 | Dennison |
| 6,791,102 B2 | 9/2004 | Johnson et al. |
| 6,797,979 B2 | 9/2004 | Chiang et al. |
| 6,800,504 B2 | 10/2004 | Li et al. |
| 6,800,563 B2 | 10/2004 | Xu |
| 6,805,563 B2 | 10/2004 | Ohashi et al. |
| 6,815,704 B1 | 11/2004 | Chen |
| 6,830,952 B2 | 12/2004 | Lung et al. |
| 6,850,432 B2 | 2/2005 | Lu et al. |
| 6,859,389 B2 | 2/2005 | Idehara et al. |
| 6,861,267 B2 | 3/2005 | Xu et al. |
| 6,864,500 B2 | 3/2005 | Gilton |
| 6,864,503 B2 | 3/2005 | Lung et al. |
| 6,867,638 B2 | 3/2005 | Saiki et al. |
| 6,888,750 B2 | 5/2005 | Walker et al. |
| 6,894,305 B2 | 5/2005 | Yi et al. |
| 6,903,362 B2 | 6/2005 | Wyeth et al. |
| 6,909,107 B2 | 6/2005 | Rodgers et al. |
| 6,927,410 B2 | 8/2005 | Chen |
| 6,933,516 B2 | 8/2005 | Xu |
| 6,936,840 B2 | 8/2005 | Sun et al. |
| 6,937,507 B2 | 8/2005 | Chen |
| 6,972,430 B2 | 12/2005 | Casagrande et al. |
| 6,992,932 B2 | 1/2006 | Cohen et al. |
| 7,023,009 B2 | 4/2006 | Kostylev et al. |
| 7,033,856 B2 | 4/2006 | Lung et al. |
| 7,042,001 B2 | 5/2006 | Kim et al. |
| 7,067,865 B2 | 6/2006 | Lung et al. |
| 7,132,675 B2 | 11/2006 | Gilton |
| 7,166,533 B2 | 1/2007 | Happ |
| 7,214,958 B2 | 5/2007 | Happ |
| 7,220,983 B2 | 5/2007 | Lung |
| 2005/0029502 A1 | 2/2005 | Hudgens |
| 2005/0093022 A1 | 5/2005 | Lung |
| 2005/0201182 A1 | 9/2005 | Osada et al. |
| 2005/0212024 A1 | 9/2005 | Happ |
| 2005/0215009 A1 | 9/2005 | Cho |
| 2006/0108667 A1 | 5/2006 | Lung |
| 2006/0110878 A1 | 5/2006 | Lung et al. |
| 2006/0284157 A1 | 12/2006 | Chen et al. |
| 2006/0284158 A1 | 12/2006 | Lung et al. |
| 2006/0284214 A1 | 12/2006 | Chen |
| 2006/0284279 A1 | 12/2006 | Lung et al. |
| 2006/0286709 A1 | 12/2006 | Lung et al. |
| 2006/0286743 A1 | 12/2006 | Lung et al. |
| 2007/0030721 A1 | 2/2007 | Segal et al. |
| 2007/0108077 A1 | 5/2007 | Lung et al. |
| 2007/0108429 A1 | 5/2007 | Lung |
| 2007/0108430 A1 | 5/2007 | Lung |
| 2007/0108431 A1 | 5/2007 | Chen et al. |
| 2007/0109836 A1 | 5/2007 | Lung |
| 2007/0109843 A1 | 5/2007 | Lung et al. |
| 2007/0111429 A1 | 5/2007 | Lung |
| 2007/0115794 A1 | 5/2007 | Lung |
| 2007/0117315 A1 | 5/2007 | Lai et al. |
| 2007/0121363 A1 | 5/2007 | Lung |
| 2007/0121374 A1 | 5/2007 | Lung et al. |
| 2007/0126040 A1 | 6/2007 | Lung |
| 2007/0131922 A1 | 6/2007 | Lung |
| 2007/0131980 A1 | 6/2007 | Lung |
| 2007/0138458 A1 | 6/2007 | Lung |
| 2007/0147105 A1 | 6/2007 | Lung et al. |
| 2007/0154847 A1 | 7/2007 | Chen et al. |
| 2007/0155172 A1 | 7/2007 | Lai et al. |
| 2007/0158632 A1 | 7/2007 | Ho |
| 2007/0158633 A1 | 7/2007 | Lai et al. |
| 2007/0158645 A1 | 7/2007 | Lung |
| 2007/0158690 A1 | 7/2007 | Ho et al. |
| 2007/0158862 A1 | 7/2007 | Lung |
| 2007/0161186 A1 | 7/2007 | Ho |
| 2007/0173019 A1 | 7/2007 | Ho et al. |
| 2007/0173063 A1 | 7/2007 | Lung |
| 2007/0176261 A1 | 8/2007 | Lung |

FOREIGN PATENT DOCUMENTS

| | | |
|---|---|---|
| WO | 01/45108 | 6/2001 |

OTHER PUBLICATIONS

Adler, D. et al., "Threshold Switching in Chalgenid-Glass Thin Films," J. Appl/Phys 51(6), Jun. 1980, pp. 3289-3309.

Ahn, S.J. et al., "A Highly Manufacturable High Density Phase Change Memory og 64 Mb and Beyond," IEEE IEDM 2004, pp. 907-910.

Axon Technologies Corporation paper: Technology Description, pp. 1-6.

Bedeschi, F. et al., "4-MB MOSFET-Selected Phase-Change Memory Experimental Chip," IEEE, 2004, 4 pp.

Blake thesis, "Investigation of GeTeSb5 Chalcogenide Films for Use as an Analog Memory, "AFIT/GE/ENG/00M-04, Mar. 2000 121 pages.

Chen, et al., "Non-Volatile Resistive Switching for Advanced Memory Applications," IEEE IEDM, Dec. 5-7 2005, 4 pp.

Cho, S.L. et al., "Highly Scalable On-axis Confined Cell Structure for High Density PRAM beyond 256Mb," 2005 Symposium on VLSI Technology Digest of Technical Papers, pp. 96-97.

Gibson, G.A. et al., "Phase-change Recording Medium that Enables Ultrahigh-density Electron-beam Data Storage," Applied Physics Letter, 2005, 3 pp., vol. 86.

Gill, Manzur et al., "A High-Performance Nonvolatile Memory Technology for Stand-Alone Memory and Embedded Applications," 2002 IEEE-ISSCC Technical Digest (TD 12.4), 7 pp.

Ha, Y.H. et al., "An Edge Contact Type Cell from Phase Change RAM Featuring Very Low Power Consumtion," 2003 Symposium on VSLI Technology Digest of Technical Papers, pp. 175-176.

Happ, T.D. et al., "Novel None-Mask Self-Heating Pillar Phase Change Memory," 2006 Symposium on VLSI Technology, 2 pp.

Haring Bolivar, P. et al., "Lateral Design for Phase Change Random Access Memory Cells with Low-Current Consumption," presented at 3rd E*PCOS 04 Symposium in Balzers, Principality of Liechtenstein, Sep. 4-7, 2004, 4 pp.

Horii, H. et al., "A Novel Cell Technology Using N-doped GeSbTe Films for Phase Change RAM," 2003 Symposium on VLSI Technology Digest of Technical Papers, pp. 177-178.

Hudgens, S. et al., "Overview of Phase-Change Chalcogenide Non-volatile Memory Technology," MRS Bulletin, Nov. 2004, pp. 829-832.

Hwang, Y. N. et al., "Full Integration and Reliability Evaluation of Phase-Change RAM Based on 0.24mm-CMOS Technologies," 2003 Symposium on VLSI Technology Digest of Technical Papers, pp. 173-174.

Iwasaki, Hiroko et al, "completely Erasable Phase Change Optical Disk," Jpn. J. Appl. Phys., Feb. 1992, pp. 461-465, vol. 31.

Jeong, C.W. et al., "Switching Current Scaling and Reliability Evaluation in PRAM," IEEE Non-Volatile Semiconductor Memory Workshop, Monterey, CA, 2004, pp. 28-29 and workshop cover sheet.

Kim, Kinam et al., "Reliability Investigations for Manufacturable High Density PRAM," IEEE 43rd Annual International Reliability Physics Symposium, San Jose, 2005, pp. 157-162.

Kojima, Rie et al., "Ge-Sn-Sb-Te Phase-change Recording Material Having High Crystallization Speed," Proceedings of PCOS 2000, pp. 36-41.

Lacita, A. L.; "Electrothermal and Phase-change Dynamics in Chalcogenide-based Memories," IEEE IEDM 2004, 4 pp.

Lai, Stefan, "Current Status of the Phase Change Memory and Its Future," IEEE IEDM 2003, pp. 255-258.

Lai, Stephan et al., OUM-A 180 nm Nonvolatile Memory Cell Element Technology for Stand Alone and Embedded Applications, IEEE IEDM 2001, pp. 803-806.

Lankhorst, Martijn H. R., et al; Low-Cost and Nanoscale Non-Volatile Memory Concept for Future Silicon Chips, Mar. 13, 2005, 6 pp., Nature Materials Advance Online Publication, www.nature.com/naturematerials.

"Magnetic Bit Boost," www.sciencenews.org <http://www.sciencenews.org>, Dec. 18 & 25, 2004, p. 389, vol. 166.

Mott, Nevill, "Electrons in Glass," Nobel Lecture, Dec. 8, 1977, Physics, 1977, pp. 403-413.

"New Memories Tap Spin, Gird for Battle," Science News, Apr. 3, 1999, p. 223, vol. 155.

Ovonyx Non-Confidential paper entitled "Ovonic Unified Memory," Dec. 1999, pp. 1-80.

Ovshinsky, Sandford R., "Reversible Electrical Switching Phenomena in Disordered Structures," Physical Review Letters, vol. 21, No. 20, Nov. 11, 1968, pp. 1450-1453.

Owen, Alan E. et al., "Electronic Conduction and Switching in Chalcogenide Glasses," IEEE Transactions on Electron Devices, vol. Ed. 20, No. 2, Feb. 1973, pp. 105-122.

Pellizer, F. et al., "Novel ?Trench Phase-Change Memory Cell for Embedded and Stand-Alone Non-Volatile Memory Applications," 2004 Symposium on VLSI Technology Digest of Technical Papers, pp. 18-19.

Pirovano, Agostino et al., "Reliability Study of Phase-Change Non-volatile Memories," IEEE Transactions on Device and Materials Reliability, Sep. 2004, pp. 422-427, vol. 4, No. 3.

Prakash, S. et al., "A Guideline for Designing Chalcogenide-Based Glasses for Threshold Switching Characteristics," IEEE Electron Device Letters, vol. 18, No. 2, Feb. 1997, pp. 45-47.

Radaelli, A. et al., "Electronic Switching Effect and Phase-Change Transition in Chalcohenide Materials," IEEE Electron Device Letters, Oct. 2004, pp. 684-686, vol. 25, No. 10.

"Remembering on the Cheap," www.sciencenews.org <http://www.sciencenews.org>, Mar. 19, 2005, p. 189, vol. 167.

Rochefort, C. et al., "Manufacturing of High Aspect-Ration p-n Junctions Using Vapor Phase Doping for Application in Multi-Resurf Devices," IEEE 2002.

Strauss, Karl F. et al., "Overview of Radiation Tolerant Unlimited Write Cycle Non-Volatile Memory," IEEE 2000.

Subramanian, Vivek et al., "Low Leakage Germanium-Seeded Laterally-Crystallized Single-Grain 100-nm TFT's for Vertical Intergration Applications," IEEE Electron Device Letters, vol. 20, No. 7, Jul. 1999.

Wicker, Guy et al., Nonvolatile, High Density, High Performance Phase Change Memory, 1999, http://klabs.org/richcontent/MAPLDCon99/Papers/P21_Tyson_P.
PDF#search=nonvolatile%20high%density%20high%20 performance%20phase%20change%20memory <http://klabs.org/richcontent/MAPLDCon99/Papers/P21_Tyson_P.
PDF#search='nonvolatile%20high%20high%20density%20 high%20performance%20phase%20change%20memory>',8 pages.

Wolf, Stanley, Excerpt from: Silicon Processing for the VLSI Era-vol. 4, pp. 674-679, 2004.

Wicker, Guy, "A Comprehensive Model of Submicron Chalcogenide Switching Devices," Doctoral Dissertation, Wayne State University, Detroit, MI, 1996.

Wuttig, Matthias, "Towards a Universal Memory?" Nature Materials, Apr. 2005, pp. 265-266, vol. 4.

Yi, J. H. et al., "Novel Cell Structure of PRAM with Thin Metal Layer Inserted GeSbTe," IEEE IEDM 2003, 4 pages.

Yonehara, T. et al., "Control of Grain Boundary Location by Selective Nucleation Over Amorphous Substrates," Mat. Res. Soc. Symp. Proc., vol. 106, 1998, pp. 21-26.

Ahn, S. J. et al., "Highly Reliable 5nm Contact Cell Technology for 256Mb PRAM," VLSI Technology, Digest of Technical Papers, Jun. 14-16, 2005, pp. 98-99.

Atwood, G, et al., "90nm Phase Change Technology with mTrench and Lance Cell Elements," VLSI Technology, Systems and Applications, Apr. 23-25, 2007, pp. 1-2.

Chao, D-S. et al., "Low Programming Current Phase Change Memory Cell with Double gst Thermally Confined Structure," VLSI-TSA 2007, International symposium Apr. 23-25, 2007, 2pp.

"Thermal Conductivity of Crystalline Dielectrics" in CRC Handbook of Chemistry and Physics, Internet Version 2007, (87th edition), David R. Lide, ed. Taylor and Francis, Boca Raton, FL.

Schafft, Harry A. et al., "Thermal Conductivity Measurements of Thin Films Silicon Dioxide", Proceedings of the IEEE 1989 International Conference on Microelectronic Test Structures, vol. 2, No. 1, Mar. 1989, pp. 121-124.

"Optimized Thermal Capacitance in a Phase Change Memory Cell Design," IPCOM000141986D, IP.com Prior Art Database, Oct. 18, 2006, 4 pp.

PROGRAMMABLE RESISTIVE MEMORY WITH DIODE STRUCTURE

REFERENCE TO RELATED APPLICATION

International Business Machines Corporation, a New York corporation; Macronix International Corporation, a Taiwan corporation, and Infineon Technologies A.G., a German corporation, are parties to a Joint Research Agreement.

BACKGROUND OF THE INVENTION

1. Field of the Invention

The invention relates to integrated circuit nonvolatile memory. In particular, the invention relates to programmable resistive nonvolatile memory, such as phase change memory.

2. Description of Related Art

Nonvolatile memory stores data without requiring a continuous supply of power. Programmable resistive memory such as phase change memory is an example of nonvolatile memory. A high current reset electrical pulse melts and quenches the programmable resistive element into an amorphous state, raising the resistance of the programmable resistive element. A low current set electrical pulse crystallizes and lowers the resistance of the programmable resistive element.

Although the reset electrical pulse requires a high current, the structure of a programmable resistive RAM cell is a factor limiting the amount of current flowing through the programmable resistive element of the cell. The physical positioning of the contacts on either end of the programmable resistive element, requires the high current reset pulse to flow through an end of the programmable resistive element with a relatively small physical cross-section. Accordingly, it would be desirable if the high current reset pulse could flow through a larger physical area to reach the programmable resistive RAM cell.

SUMMARY OF THE INVENTION

One aspect of the technology is an integrated circuit with nonvolatile memory cells, so that diode structures are formed adjacent to the programmable resistive elements of the nonvolatile memory cells. The circuit includes conductive columns, conductive rows, a nonconductive layer separating the conductive columns from the diode structures, the diode structures, and the programmable restive elements.

The conductive rows and columns are conductively coupled to the nonvolatile memory cells. They correspond typically to bit lines and word lines.

In some embodiments, the conductive rows are typically arranged in parallel, as are the conductive columns. The conductive rows and columns each define a planar orientation, parallel with each other.

The diode structures connect the programmable resistive elements with the conductive rows. Each of the diode structures includes a first terminal and a second terminal.

In some embodiments, the first terminal of each diode structure has an exterior surface, and an interior surface connected to at least one of the programmable resistive elements. In some embodiments, the second terminal of each diode structure is in contact with a junction area on the exterior surface of the first terminal providing a diode junction oriented orthogonal to the planar orientations of the conductive rows and columns.

In some embodiments, the first terminal of each diode structure has an annular shape with an exterior surface, and an interior surface surrounding at least one of the programmable resistive elements. In some embodiments, the second terminal of each diode structure is in contact with the exterior surface of the first terminal.

In some embodiments, the first terminals physically separate the programmable resistive elements and the second terminals.

In some embodiments, the programmable resistive elements each have a sidewall surface connected to the interior surface of the first terminal of at least one of the diode structures, and a bottom surface conductively coupled to at least one of the conductive columns.

The programmable resistive elements each have a sidewall surface surrounded by the interior surface of the first terminal of at least one of the diode structures, and a bottom surface conductively coupled to at least one of the conductive columns.

In some embodiments, the programmable resistive elements each have a top surface having a smaller area than the sidewall surface. In some embodiments, the programmable resistive elements include at least a chalcogenide.

In some embodiments of the diode structures, a self-aligned silicide is formed over the second terminals to form the second terminals. In some embodiments the conductive rows are formed along the diode structures, such as with conductive spacers adjacent to the second terminals of the diode structures. In various embodiments, the bit lines and word lines correspond to the self-aligned silicide or the conductive spacers, or if material corresponding to the self-aligned silicide or the conductive spacers is absent, then to conductive traces that connect the circuit to the remaining circuitry.

In some embodiments, the second terminal and the first terminal are arranged, so that in response to a forward bias on a particular one of the diode structures, a driving current flows through: at least one of the conductive rows conductively coupled to the particular one of the diode structures, the particular one of the diode structures, a programmable resistive element of the programmable resistive elements conductively connected to the particular one of the diode structures, and at least one of the conductive columns conductively coupled to the programmable resistive element. In many embodiments, the first and second terminals of the diode structures have opposite doping types.

The highly controllable process is an advantage of several embodiments. In some embodiments, each nonvolatile memory cell formed by the method has a size of no more than 5 F^2, whereby F is a minimum feature size of a lithographic process used in manufacture of the method. In some embodiments, the diode structures include a sample quantity of diode structures. The first terminals of the sample quantity have a size variation of at least about 4 nm. The programmable resistive elements of the sample quantity have a second size variation of less than about 2 nm, demonstrating the process control over the programmable resistive elements despite a lack of corresponding process control over the first terminals. More generally, in another embodiment, the size variation of the programmable resistive elements of the sample quantity is less than the size variation of the first terminals of the sample quantity. An exemplary choice of the sample quantity of diode structures includes diode structures on different sides of the array of nonvolatile memory cells.

Another aspect of the technology is a method of forming the integrated circuit as described.

In many embodiments, the first terminals are formed after the second terminals. In some embodiments, the second terminals are formed as follows. A layer of the second terminals is formed over the conductive columns, and cavities are formed in the layer of the second terminals by removing material from the layer of the second terminals. Later steps such as forming the first terminals and forming the programmable resistive elements occur at least partly in the cavities of the layer of the second terminals. A further embodiment adds the following, before the first terminals are formed. After the layer of the second terminals is formed, an oxide layer is formed over the layer of the second terminals; and an undercut is formed in the cavities of the layer of the second terminals and the oxide layer, by laterally removing more material from the layer of the second terminals than from the oxide layer. In an embodiment this undercut determines the sizes of the programmable resistive elements.

In many embodiments, the first terminals are formed as follows. A layer of the first terminals is formed over the second terminals. In some embodiments at least part of the layer of the first terminals positioned outside the cavities of the second terminals is removed. In some embodiments the layer of the first terminals at least partly fills cavities of the second terminals. In some embodiments, after the conductive columns are formed, an oxide layer covering the conductive columns is formed, and optionally part of the layer of the first terminals and part of the oxide layer are removed to leave cavities in which to form programmable resistive elements.

Other aspect of the technology is an integrated circuit with multiple nonvolatile memory cells, or one nonvolatile memory cell, as disclosed herein.

Other embodiments are disclosed herein.

DETAILED DESCRIPTION

Various embodiments are directed at a manufacturing method for memory, such as nonvolatile embedded memory implementing programmable resistance RAM. Examples of programmable resistance device RAM are resistance memory (RRAM), polymer memory, and phase change memory (PCRAM). The programmable resistive elements are formed to have a cross-section small than the cross-section of the upper portion of the interlayer contacts of programmable resistance RAM.

FIGS. 1-15 are a sample process flow to make a programmable resistive device with a diode structure.

Figure 1:
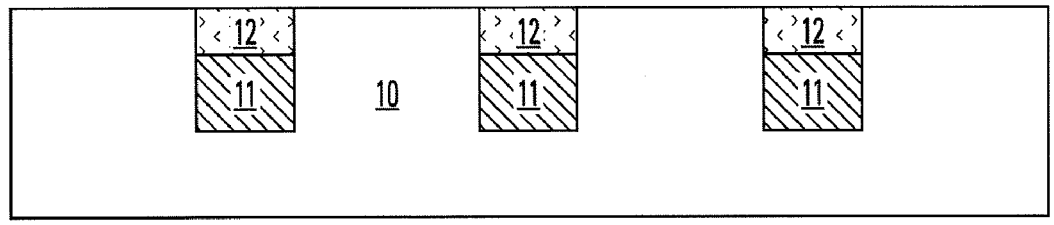
FIG. 1 is a cross-sectional view during the manufacturing process that shows the formation of bit lines in an oxide.

FIG. 1 is a cross-sectional view during the manufacturing process that shows the formation of bit lines in an oxide. Prior to this, FEOL, or front end of line, processing is performed, to complete early steps in semiconductor fabrication, such as up to but not including first metallization. Such early steps include forming the transistor circuitry, multiple semiconductor layers, and interlayer contacts among the multiple semiconductor layers. Bit lines are formed in the oxide 10, such as a bilayer bit line of W 11 and TiN 12. Other example materials for the metal bit lines are TiN/AlCu/Ti/TiN, TaN/Cu. The bit lines are in parallel (extending into and out of FIG. 1) and collectively define a planar orientation. Also, each bit line by itself defines a linear orientation.

Figure 2:
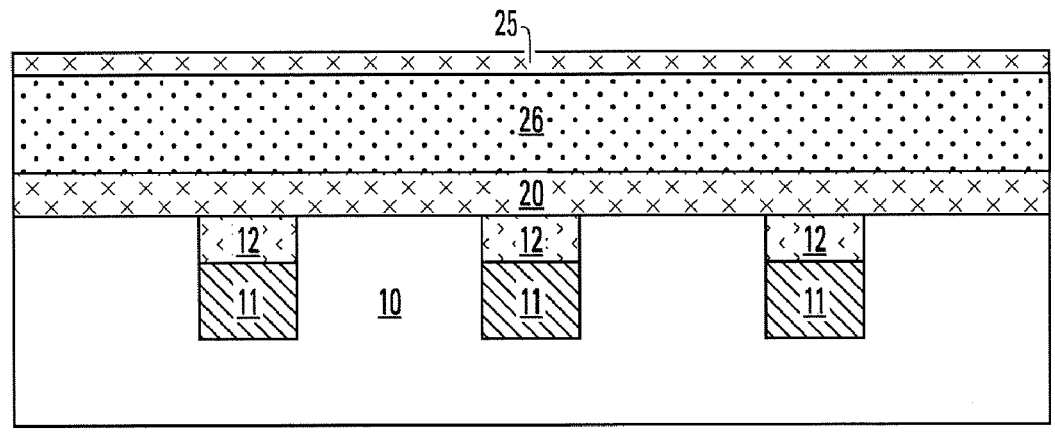
FIG. 2 is a cross-sectional view during the manufacturing process that shows the deposition of n-type silicon layer between silicon oxide layers, where the n-type silicon layer is one doping type of the diode structure.

FIG. 2 is a cross-sectional view during the manufacturing process that shows the deposition of n-type silicon layer between silicon oxide layers, where the n-type silicon layer is one doping type of the diode structure. Silicon oxide layer 20 is deposited. Silicon oxide layer 20 is a nonconductive layer that isolates the bit lines 11 and 12 from the subsequently formed N-type silicon layer 26 and P-type silicon 39. Then, N-type silicon layer 26 is deposited. Silicon oxide layer 25 is deposited.

Figure 3:
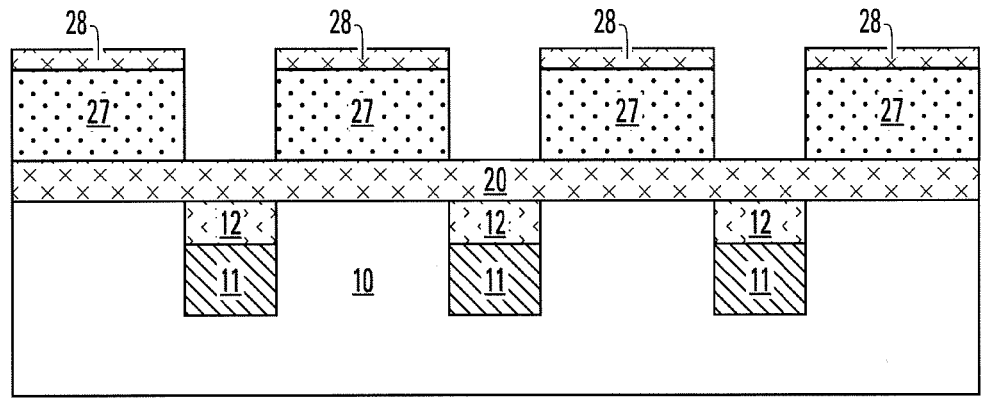
FIG. 3 is a cross-sectional view during the manufacturing process that shows the formation of vias by removing earlier deposited layers, so that the phase change memory cells can be formed in the vias in the word line-shaped n-type material.

FIG. 3 is a cross-sectional view during the manufacturing process that shows the formation of vias by removing earlier deposited layers, so that the phase change memory cells can be formed in the vias in the word line-shaped n-type material. After defining the holes lithographically, the holes are etched (via e.g. reactive ion etching) through the top silicon oxide layer 25 and the n-type silicon layer 26. Wet etching, dry etching, or some combination of wet etching and dry etching, are alternative methods. The bottom silicon oxide layer 28 acts as an etch stop for removing the vias in the n-type silicon layer 26. Separate islands are formed of top silicon oxide layer 28 and the n-type silicon layer 27.

Figure 4:
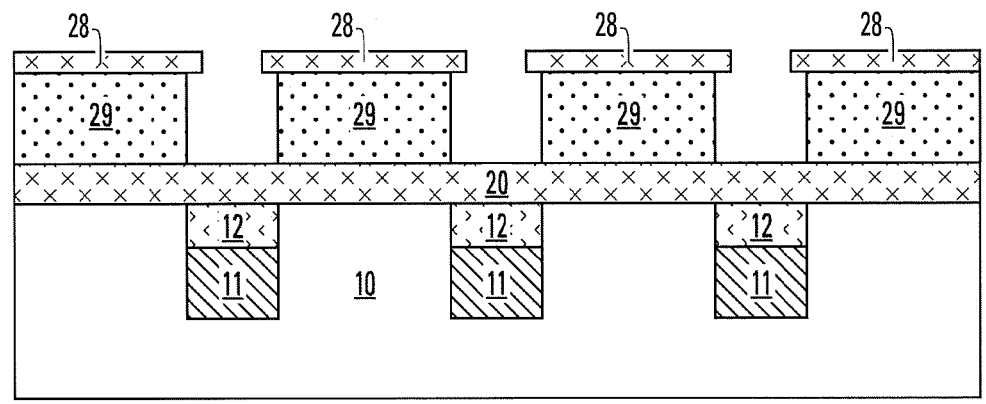
FIG. 4 is a cross-sectional view during the manufacturing process that shows undercut etching to affect the subsequent deposition of p-type silicon.

FIG. 4 is a cross-sectional view during the manufacturing process that shows undercut etching to affect the subsequent deposition of p-type silicon. An undercut is established between the n-type silicon layer 27 and the top silicon oxide layer 28, by purposely overetching the n-type silicon layer 27. The remaining portion is n-type silicon layer 29.

Figure 5:
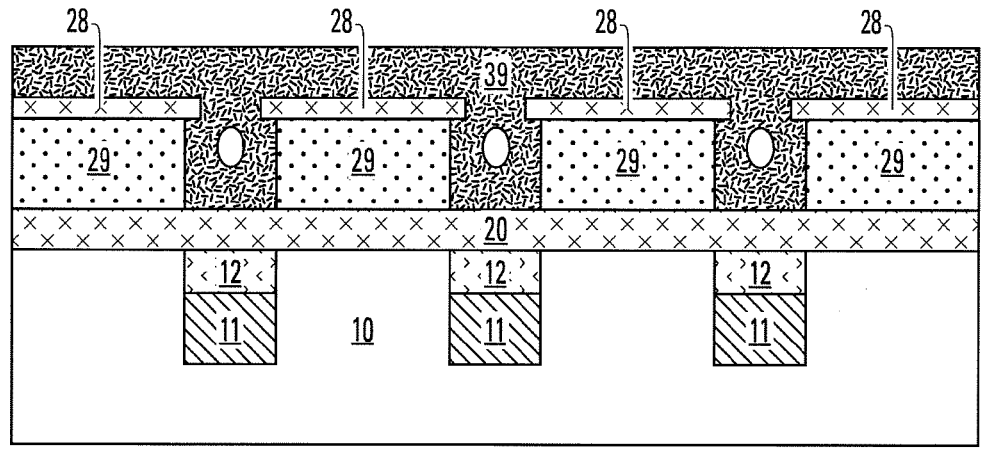
FIG. 5 is a cross-sectional view during the manufacturing process that shows the deposition of p-type silicon, where the p-type silicon is the other doping type of the diode structure.

FIG. 5 is a cross-sectional view during the manufacturing process that shows the deposition of p-type silicon, where the p-type silicon is the other doping type of the diode structure. P-type silicon 39 is deposited to fill the vias between the islands of top silicon oxide layer 28 and the n-type silicon layer 27. However, the filling is incomplete, leaving empty pockets within the p-type silicon 39. One empty pocket of p-type silicon 39 is in each via.

Figure 6:
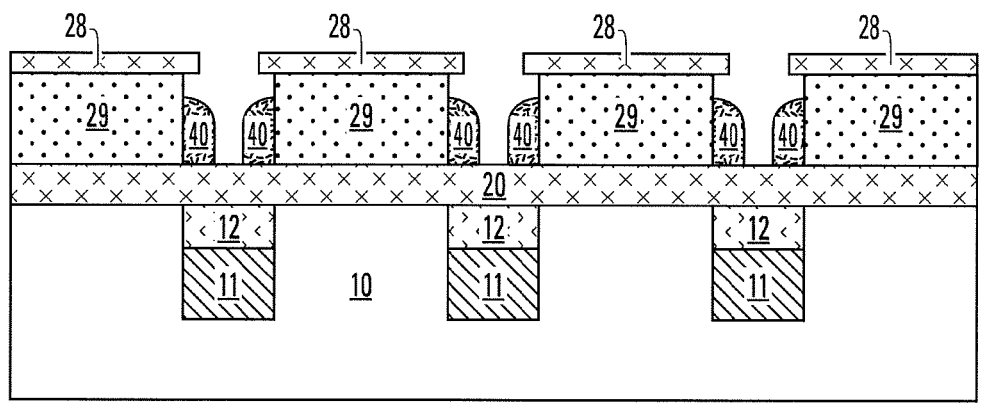
FIG. 6 is a cross-sectional view during the manufacturing process that shows removal of the p-type silicon to form spacers of p-type material in the vias formed earlier.

FIG. 6 is a cross-sectional view during the manufacturing process that shows removal of the p-type silicon to form spacers of p-type material in the vias formed earlier. The p-type silicon spacers 40 remain after the etching. The p-type silicon spacers 40 have an annular shape with an exterior surface in contact with the n-type silicon layer 29, defining a junction area, and providing a diode junction. The purpose of the undercut between the n-type silicon layer 27 and the top silicon oxide layer 28, has been fulfilled by the formation of the p-type silicon spacers 40. The remaining cavity in the vias between the p-type silicon spacers 40 is to be filled by programmable resistive elements, and its size is determined by the size of the undercut formed in FIG. 4. The size of the undercut is more controllable than the size of the vias formed in FIG. 3. Thus, the size variation of the p-type silicon spacers 40 (which act as diode first terminals) is greater across a sample quantity of memory cells on an array, than the size variation of the programmable resistive elements across the same sample quantity of memory cells on the same array.

Figure 7:
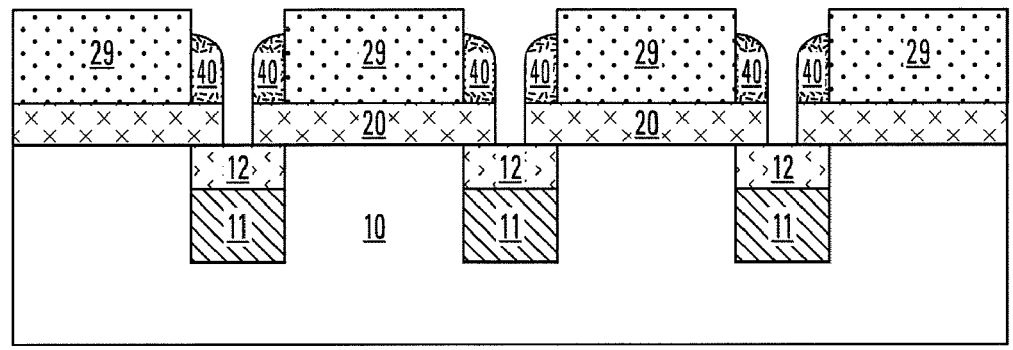
FIG. 7 is a cross-sectional view during the manufacturing process that shows the formation, between the p-type spacers, of holes through the silicon oxide layer in which programmable resistive material is to be deposited.

FIG. 7 is a cross-sectional view during the manufacturing process that shows the formation, between the p-type spacers, of holes through the silicon oxide layer in which programmable resistive material is to be deposited. The top silicon oxide layer 28 of the island is removed. The bottom silicon oxide layer 20 that is exposed by the p-type silicon spacers 40 is removed, leaving space for the programmable resistive material to be deposited.

Figure 8:
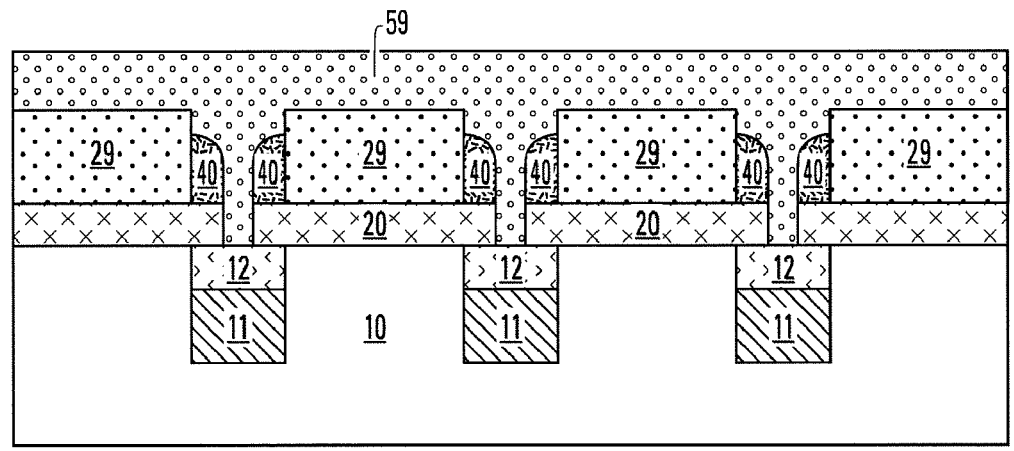
FIG. 8 is a cross-sectional view during the manufacturing process that shows deposition of programmable resistive material.

FIG. 8 is a cross-sectional view during the manufacturing process that shows deposition of programmable resistive material. Programmable resistive material 59 is deposited, filling the holes in the bottom silicon oxide layer 20, and filling the space between the p-type silicon spacers 40.

Embodiments of the memory cell include phase change based memory materials, including chalcogenide based materials and other materials, for the resistive elements 52 and 54. Chalcogens include any of the four elements oxygen (O), sulfur (S), selenium (Se), and tellurium (Te), forming part of group VI of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from column six of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_a Ge_b Sb_{100-(a+b)}$. One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. These percentages are atomic percentages that total 100% of the atoms of the constituent elements. (Ovshinsky U.S. Pat. No. 5,687,112, cols 10-11.) Particular alloys evaluated by another researcher include Ge2Sb2Te5, GeSb2Te4 and GeSb4Te7 (Noboru Yamada, "Potential of Ge—Sb—Te Phase-Change Optical Disks for High-Data-Rate Recording", SPIE v.3109, pp. 28-37 (1997).)

More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky '112 at columns 11-13, which examples are hereby incorporated by reference.

Chalcogenides and other phase change materials are doped with impurities in some embodiments to modify conductivity, transition temperature, melting temperature, and other properties of memory elements using the doped chalcogenides. Representative impurities used for doping chalcogenides include nitrogen, silicon, oxygen, silicon dioxide, silicon nitride, copper, silver, gold, aluminum, aluminum oxide, tantalum, tantalum oxide, tantalum nitride, titanium and titanium oxide. See, e.g. U.S. Pat. No. 6,800,504, and U.S. Patent Application Publication No. US 2005/0029502.

Phase change alloys are capable of being switched between a first structural state in which the material is in a generally amorphous solid phase, and a second structural state in which the material is in a generally crystalline solid phase in its local order in the active channel region of the cell. These alloys are at least bistable. The term amorphous is used to refer to a relatively less ordered structure, more disordered than a single crystal, which has the detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase. Typically, phase change materials may be electrically switched between different detectable states of local order across the spectrum between completely amorphous and completely crystalline states. Other material characteristics affected by the change between amorphous and crystalline phases include atomic order, free electron density and activation energy. The material may be switched either into different solid phases or into mixtures of two or more solid phases, providing a gray scale between completely amorphous and completely crystalline states. The electrical properties in the material may vary accordingly.

Phase change alloys can be changed from one phase state to another by application of electrical pulses. It has been observed that a shorter, higher amplitude pulse tends to change the phase change material to a generally amorphous state. A longer, lower amplitude pulse tends to change the phase change material to a generally crystalline state. The energy in a shorter, higher amplitude pulse is high enough to allow for bonds of the crystalline structure to be broken and short enough to prevent the atoms from realigning into a crystalline state. Appropriate profiles for pulses can be determined, without undue experimentation, specifically adapted to a particular phase change alloy. In following sections of the disclosure, the phase change material is referred to as GST, and it will be understood that other types of phase change materials can be used. A material useful for implementation of a PCRAM described herein is $Ge_2Sb_2Te_5$.

Other programmable resistive memory materials may be used in other embodiments of the invention, including N2 doped GST, GexSby, or other material that uses different crystal phase changes to determine resistance; $Pr_xCa_yMnO_3$, $Pr_xSr_yMnO_3$, $ZrO_x$, or other material that uses an electrical pulse to change the resistance state; 7,7,8,8-tetracyanoquinodimethane (TCNQ), methanofullerene 6,6-phenyl C61-butyric acid methyl ester (PCBM), TCNQ-PCBM, Cu-TCNQ, Ag-TCNQ, $C_{60}$-TCNQ, TCNQ doped with other metal, or any other polymer material that has bistable or multi-stable resistance state controlled by an electrical pulse.

The following are short summaries describing four types of resistive memory materials. The first type is chalcogenide material, such as $Ge_xSb_yTe_z$ where x:y:z=2:2:5, or other compositions with x: 0~5; y: 0~5; z: 0~10. GeSbTe with doping, such as N—, Si—, Ti—, or other element doping is alternatively used.

An exemplary method for forming chalcogenide material uses PVD-sputtering or magnetron-sputtering method with source gas(es) of Ar, $N_2$, and/or He, etc. at the pressure of 1 mTorr~100 mTorr. The deposition is usually done at room temperature. A collimator with an aspect ratio of 1~5 can be used to improve the fill-in performance. To improve the fill-in performance, a DC bias of several tens of volts to several hundreds of volts is also used. On the other hand, the combination of DC bias and the collimator can be used simultaneously.

A post-deposition annealing treatment in vacuum or in an $N_2$ ambient is optionally performed to improve the crystallize state of chalcogenide material. The annealing temperature typically ranges from 100° C. to 400° C. with an anneal time of less than 30 minutes.

The thickness of chalcogenide material depends on the design of cell structure. In general, a chalcogenide material with thickness of higher than 8 nm can have a phase change characterization so that the material exhibits at least two stable resistance states.

A second type of memory material suitable for use in embodiments is colossal magnetoresistance ("CMR") material, such as $Pr_xCa_yMnO_3$ where x=0.5:0.5, or other compositions with x: 0~1; y: 0~1. CMR material that includes Mn oxide is alternatively used.

An exemplary method for forming CMR material uses PVD sputtering or magnetron-sputtering method with source gases of Ar, $N_2$, $O_2$, and/or He, etc. at the pressure of 1 mTorr 100 mTorr. The deposition temperature can range from room temperature to 600° C., depending on the post deposition treatment condition. A collimator with an aspect ratio of 1~5 can be used to improve the fill-in performance. To improve the fill-in performance, the DC bias of several tens of volts to several hundreds of volts is also used. On the other hand, the combination of DC bias and the collimator can be used simultaneously. A magnetic field of several tens of Gauss to as much as a Tesla (10,000 Gauss) may be applied to improve the magnetic crystallized phase.

A post-deposition annealing treatment in vacuum or in an N2 ambient or O2/N2 mixed ambient is optionally used to improve the crystallized state of CMR material. The annealing temperature typically ranges from 400° C. to 600° C. with an anneal time of less than 2 hours.

The thickness of CMR material depends on the design of the cell structure. The CMR thickness of 10 nm to 200 nm can be used for the core material. A buffer layer of YBCO ($YBaCuO_3$, which is a type of high temperature superconductor material) is often used to improve the crystallized state of CMR material. The YBCO is deposited before the deposition of CMR material. The thickness of YBCO ranges from 30 nm to 200 nm.

A third type of memory material is two-element compounds, such as $Ni_xO_y$; $Ti_xO_y$; $Al_xO_y$; $W_xO_y$; $Zn_xO_y$; $Zr_xO_y$; $Cu_xO_y$; etc, where x:y=0.5:0.5, or other compositions with x: 0~1; y: 0~1. An exemplary formation method uses a PVD sputtering or magnetron-sputtering method with reactive gases of Ar, $N_2$, $O_2$, and/or He, etc. at the pressure of 1 mTorr~100 mTorr, using a target of metal oxide, such as $Ni_xO_y$; $Ti_xO_y$; $Al_xO_y$; $W_xO_y$; $Zn_xO_y$; $Zr_xO_y$; $Cu_xO_y$; etc. The deposition is usually done at room temperature. A collimater with an aspect ratio of 1~5 can be used to improve the fill-in performance. To improve the fill-in performance, the DC bias of several tens of volts to several hundreds of volts is also used. If desired, the combination of DC bias and the collimater can be used simultaneously.

A post-deposition annealing treatment in vacuum or in an $N_2$ ambient or $O_2/N_2$ mixed ambient is optionally performed to improve the oxygen distribution of metal oxide. The annealing temperature ranges from 400° C. to 600° C. with an anneal time of less than 2 hours.

An alternative formation method uses a PVD sputtering or magnetron-sputtering method with reactive gases of $Ar/O_2$, $Ar/N_2/O_2$, pure $O_2$, $He/O_2$, $He/N_2/O_2$ etc. at the pressure of 1 mTorr~100 mTorr, using a target of metal oxide, such as Ni, Ti, Al, W, Zn, Zr, or Cu etc. The deposition is usually done at room temperature. A collimater with an aspect ratio of 1~5 can be used to improve the fill-in performance. To improve the fill-in performance, a DC bias of several tens of volts to several hundreds of volts is also used. If desired, the combination of DC bias and the collimater can be used simultaneously.

A post-deposition annealing treatment in vacuum or in an $N_2$ ambient or $O_2/N_2$ mixed ambient is optionally performed to improve the oxygen distribution of metal oxide. The annealing temperature ranges from 400° C. to 600° C. with an anneal time of less than 2 hours.

Yet another formation method uses oxidation by a high temperature oxidation system, such as a furnace or a rapid thermal pulse ("RTP") system. The temperature ranges from 200° C. to 700° C. with pure $O_2$ or $N_2/O_2$ mixed gas at a pressure of several mTorr to 1 atm. The time can range several minute to hours. Another oxidation method is plasma oxidation. An RF or a DC source plasma with pure $O_2$ or $Ar/O_2$ mixed gas or $Ar/N_2/O_2$ mixed gas at a pressure of 1 mTorr to 100 mTorr is used to oxidize the surface of metal, such as Ni, Ti, Al, W, Zn, Zr, or Cu etc. The oxidation time ranges several seconds to several minutes. The oxidation temperature ranges from room temperature to 300° C., depending on the degree of plasma oxidation.

A fourth type of memory material is a polymer material, such as TCNQ with doping of Cu, $C_{60}$, Ag etc. or PCBM-TCNQ mixed polymer. One formation method uses evaporation by thermal evaporation, e-beam evaporation, or molecular beam epitaxy ("MBE") system. A solid-state TCNQ and dopant pellets are co-evaporated in a single chamber. The solid-state TCNQ and dopant pellets are put in a W-boat or a Ta-boat or a ceramic boat. A high electrical current or an electron-beam is applied to melt the source so that the materials are mixed and deposited on wafers. There are no reactive chemistries or gases. The deposition is done at a pressure of $10^{-4}$ Torr to $10^{-10}$ Torr. The wafer temperature ranges from room temperature to 200° C.

A post-deposition annealing treatment in vacuum or in an $N_2$ ambient is optionally performed to improve the composition distribution of polymer material. The annealing temperature ranges from room temperature to 300° C. with an anneal time of less than 1 hour.

Another technique for forming a layer of polymer-based memory material is to use a spin-coater with doped-TCNQ solution at a rotation of less than 1000 rpm. After spin-coating, the wafer held (typically at room temperature or temperature less than 200° C.) for a time sufficient for solid-state formation. The hold time ranges from several minutes to days, depending on the temperature and on the formation conditions.

Figure 9:
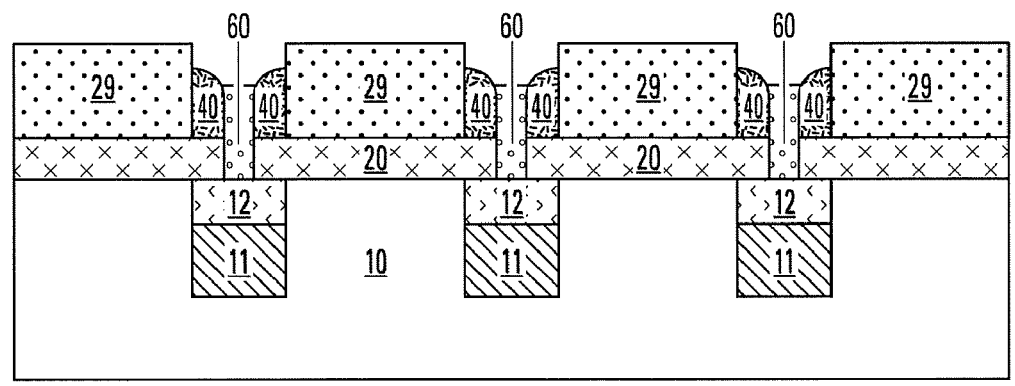
FIG. 9 is a cross-sectional view during the manufacturing process that shows the removal of excess programmable resistive material.

FIG. 9 is a cross-sectional view during the manufacturing process that shows the removal of excess programmable resistive material. Excess programmable resistive material 59 is etched back, leaving the programmable resistive material 60 in the gaps in the bottom silicon oxide layer 20, and partly in the space between the p-type silicon spacers 40. The programmable resistive material 60 has a sidewall surface connected to the interior surface of the p-type silicon spacers 40, and a bottom surface conductively coupled to the bit lines 11 and 12. The programmable resistive material 60 is physically separated from the n-type silicon layer 29 by p-type silicon spacers 40.

Figure 10:
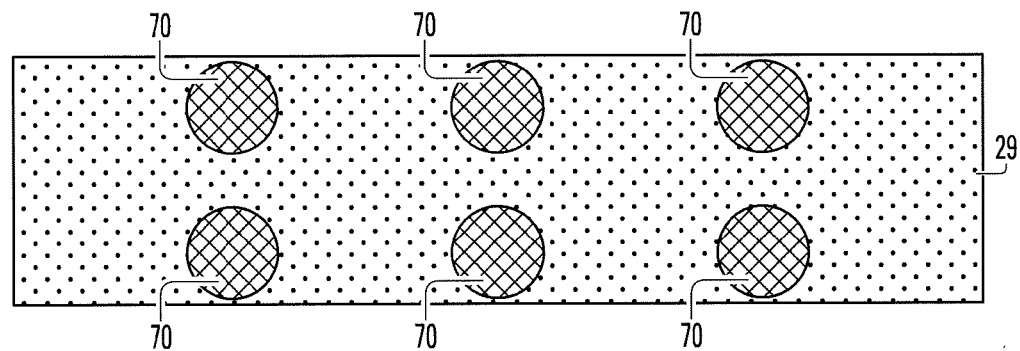
FIG. 10 is a top view, of the same step shown in FIG. 11, during the manufacturing process that shows oxide deposition to fill in the remaining volume of the vias, and chemical mechanical polishing of excess fill-in oxide.
Figure 11:
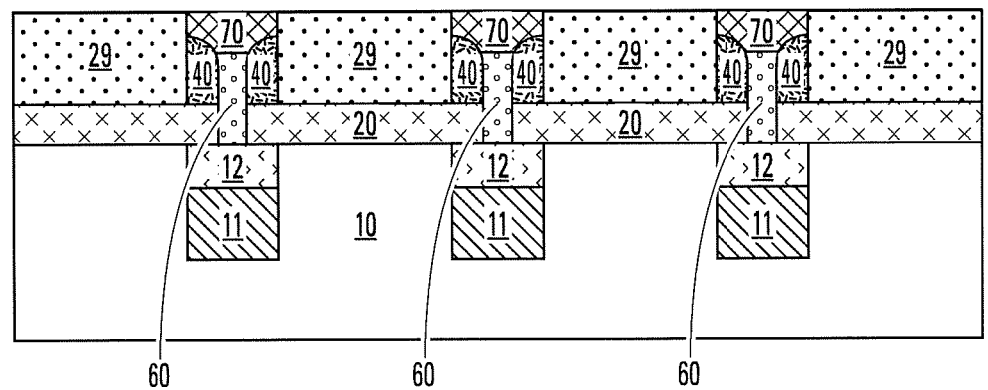
FIG. 11 is a cross-sectional view, of the same step shown in FIG. 10, during the manufacturing process that shows oxide deposition to fill in the remaining volume of the vias, and chemical mechanical polishing of excess fill-in oxide.

FIG. 10 is a top view, of the same step shown in FIG. 11, during the manufacturing process that shows oxide deposition to fill in the remaining volume of the vias, and chemical mechanical polishing of excess fill-in oxide. Oxide is formed to fill the remaining spaces between the p-type silicon spacers 40, and the remaining spaces between the n-type silicon 29. Excess oxide over the n-type silicon 29 is removed by chemical mechanical polishing. Oxide 70 remains, filling spaces between the p-type silicon spacers 40, and the spaces between the n-type silicon 29. The oxide results in the top surface of the programmable resistive material 60 not being used as a surface through which current passes. However, the relative smaller size of the top surface compared to the sidewall surface of the programmable resistive material 60 is illustrative of a greater current capacity.

FIG. 11 is a cross-sectional view, of the same step shown in FIG. 10, during the manufacturing process that shows oxide deposition to fill in the remaining volume of the vias, and chemical mechanical polishing of excess fill-in oxide.

Figure 12:
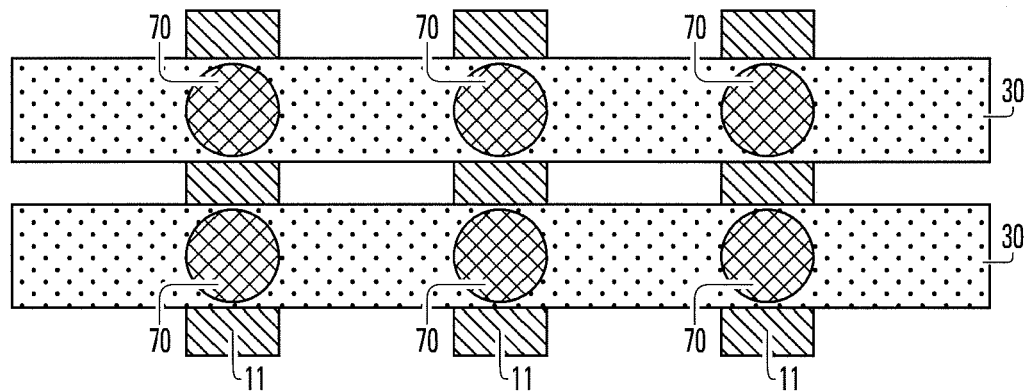
FIG. 12 is a top view, of the same step shown in FIG. 13, during the manufacturing process that shows the removal of excess n-type material to leave n-type material in word line shapes to access the memory cells.
Figure 13:
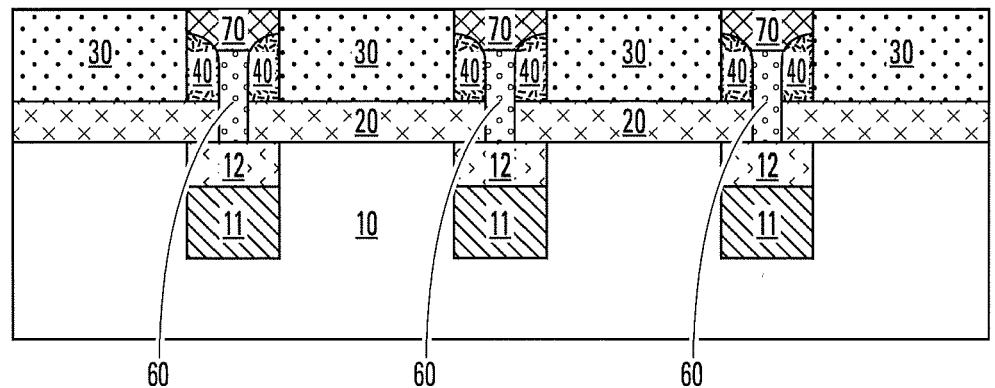
FIG. 13 is a cross-sectional view, of the same step shown in FIG. 12, during the manufacturing process that shows the removal of excess n-type material to leave n-type material in word line shapes to access the memory cells.

FIG. 12 is a top view, of the same step shown in FIG. 13, during the manufacturing process that shows the lithographic definition and removal (via e.g. reactive ion etching) of excess n-type material to leave n-type material in word line shapes to access the memory cells. Excess n-type silicon material 29 is removed, leaving word line-shaped n-type silicon material 30. Although covered by other layers, bit lines 11 are shown to illustrate both directions of accessing the memory cells.

FIG. 13 is a cross-sectional view, of the same step shown in FIG. 12, during the manufacturing process that shows the removal of excess n-type material to leave n-type material in word line shapes to access the memory cells.

Figure 14:
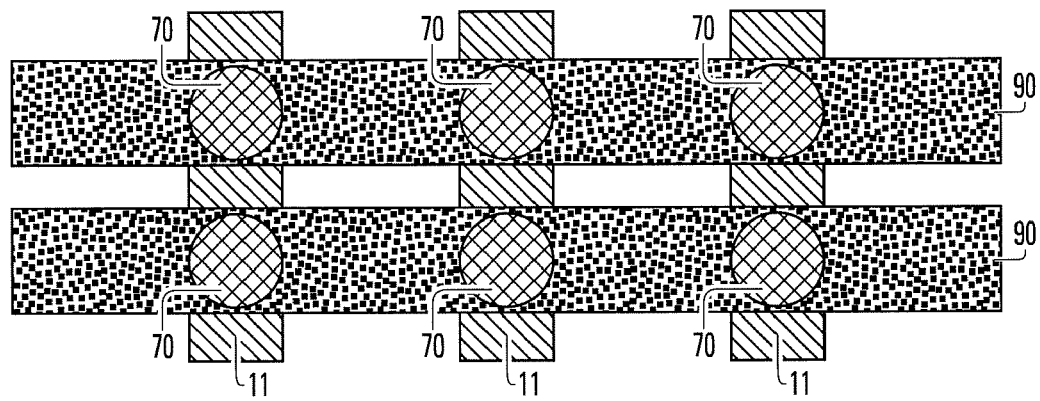
FIG. 14 is a top view, of the same step shown in FIG. 15, during the manufacturing process that shows the formation of word lines by forming salicide, or self-aligned silicide, thereby reducing the resistance of the word line-shaped n-type material to access the memory cells sufficiently for practical word line operation.
Figure 15:
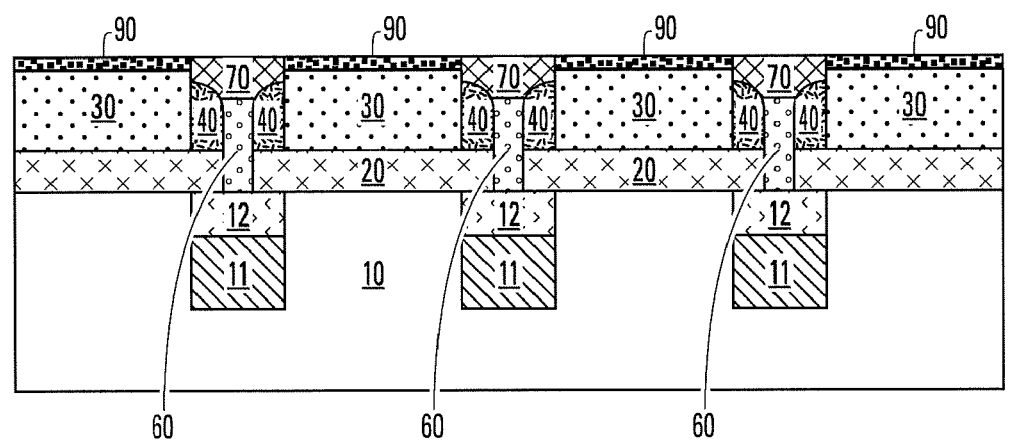
FIG. 15 is a cross-sectional view, of the same step shown in FIG. 14, during the manufacturing process that shows the formation of word lines by forming salicide, or self-aligned silicide, thereby reducing the resistance of the word line-shaped n-type material to access the memory cells sufficiently for practical word line operation.

FIG. 14 is a top view, of the same step shown in FIG. 15, during the manufacturing process that shows the formation of word lines by forming salicide, or self-aligned silicide, thereby reducing the resistance of the word line-shaped n-type material to access the memory cells sufficiently for practical word line operation. Salicide 90 is formed on word line-shaped n-type silicon material 30. The word lines are in parallel and collectively define a planar orientation. Also, each word line by itself defines a linear orientation. This planar orientation is parallel with the planar orientation defined by the bit lines. Both planar orientations are orthogonal to the diode junction orientation.

FIG. 15 is a cross-sectional view, of the same step shown in FIG. 14, during the manufacturing process that shows the formation of word lines by forming salicide, or self-aligned silicide, thereby reducing the resistance of the word line-shaped n-type material to access the memory cells sufficiently for practical word line operation. In response to a forward bias on a particular one of the diode structures (each including word line-shaped n-type silicon material 30 and a p-type silicon spacer 40), a driving current flows through: at least one of the conductive columns 11/12 conductively coupled to a programmable resistive element 60, the programmable resistive element 60 conductively connected to the particular one of the diode structures, the particular one of the diode structures (each including word line-shaped n-type silicon material 30 and a p-type silicon spacer 40), and then at least one of the conductive rows 90 conductively coupled to the particular one of the diode structures. In another embodiment where the p-type and n-type material of the diode structures is exchanged, the current path is reversed.

Figure 16:
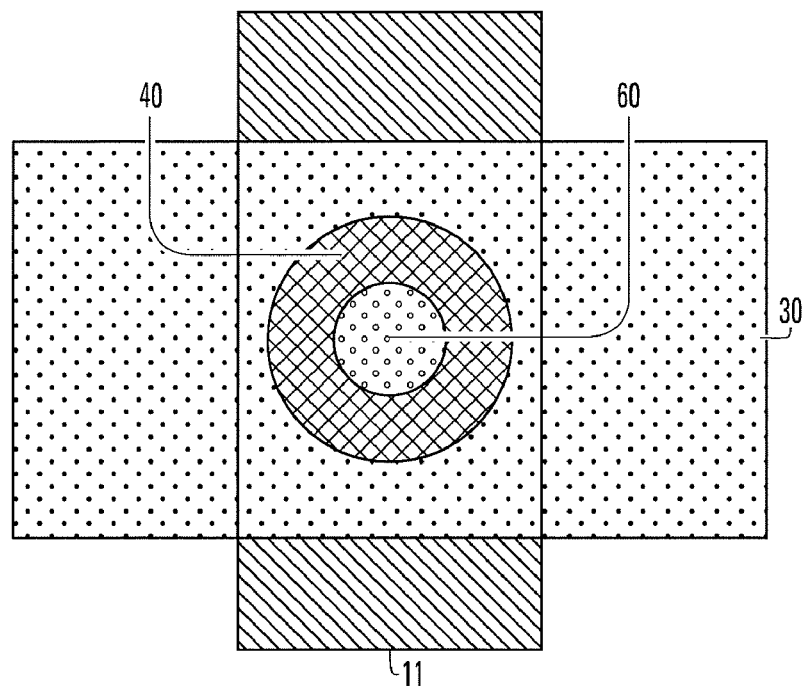
FIG. 16 is a top view, of the same device shown in FIG. 17, showing an alternative phase change memory cell with diode structure, to the one shown in FIG. 14.
Figure 17:
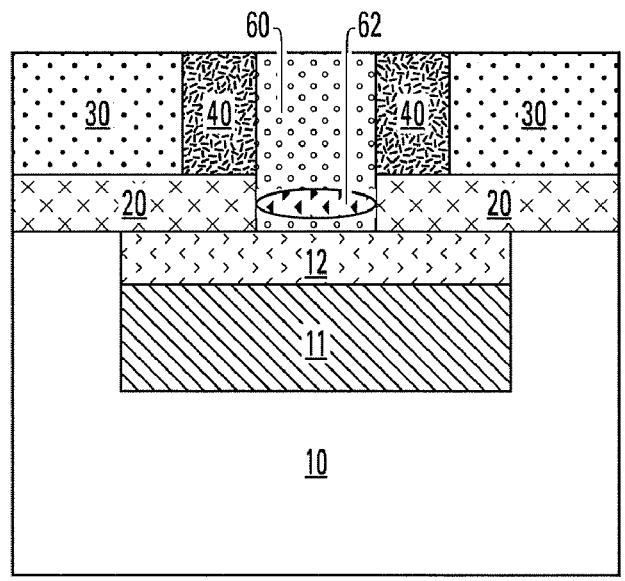
FIG. 17 is a cross-sectional view, of the same device shown in FIG. 16, showing an alternative phase change memory cell with diode structure, to the one shown in FIG. 15.

FIG. 16 is a top view, of the same device shown in FIG. 17, showing an alternative phase change memory cell with diode structure, to the one shown in FIG. 14. Word line 30 and bit line 11 access the memory cell. Word line 30 includes one doping type (e.g., n-type or p-type) of a diode structure. Semiconductor 40 has another doping type (e.g., p-type or n-type) of the diode structure. Together, word line 30 and semiconductor 40 form a diode structure. The data of the nonvolatile memory cell is stored by the phase change material 60.

FIG. 17 is a cross-sectional view, of the same device shown in FIG. 16, showing an alternative phase change memory cell with diode structure, to the one shown in FIG. 15. Active volume 62 is the portion of the phase change material 60 which actually changes characteristics to store the data of the nonvolatile memory cell. The memory cell is accessed by bilayer bit line of W 11 and TiN 12. Silicon oxide 20 is nonconductive and isolates the bit lines 11 and 12 from the subsequently formed N-type silicon layer 26 and P-type silicon 39.

FIGS. 1-7 and 18-26 are another sample process flow to make a programmable resistive device with a diode structure. In both sample processes, each of the nonvolatile memory cells has a size of no more than 5 F^2. F is a minimum feature size of a lithographic process used in manufacture of the integrated circuit.

Figure 18:
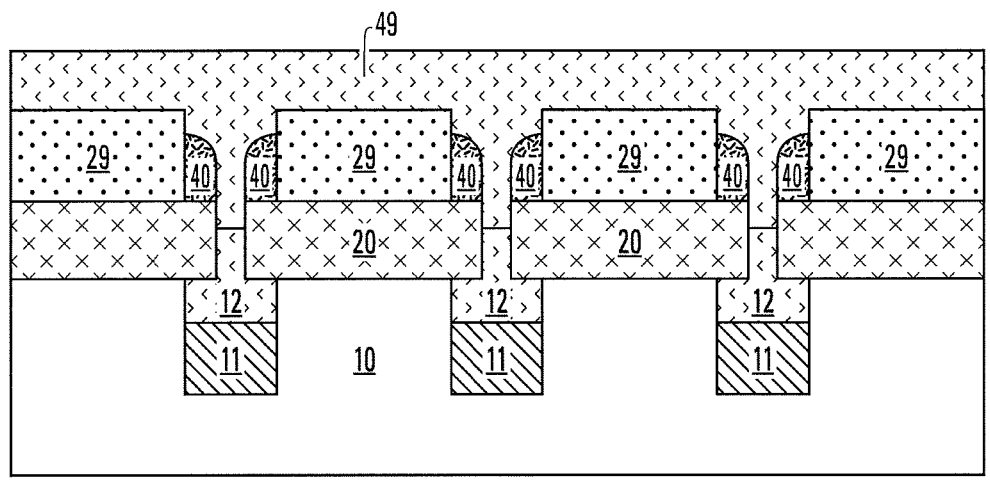
FIG. 18 is a cross-sectional view during the manufacturing process that shows the deposition of heater material prior to the deposition of programmable resistive material, thereby reducing the amount of programmable resistive material to undergo heating.

FIG. 18 is a cross-sectional view during the manufacturing process that shows the deposition of heater material prior to the deposition of programmable resistive material, thereby reducing the amount of programmable resistive material to undergo heating. Excess heater material TiN 49 is deposited by chemical vapor deposition, filling at least the holes in the bottom silicon oxide layer 20.

Figure 19:
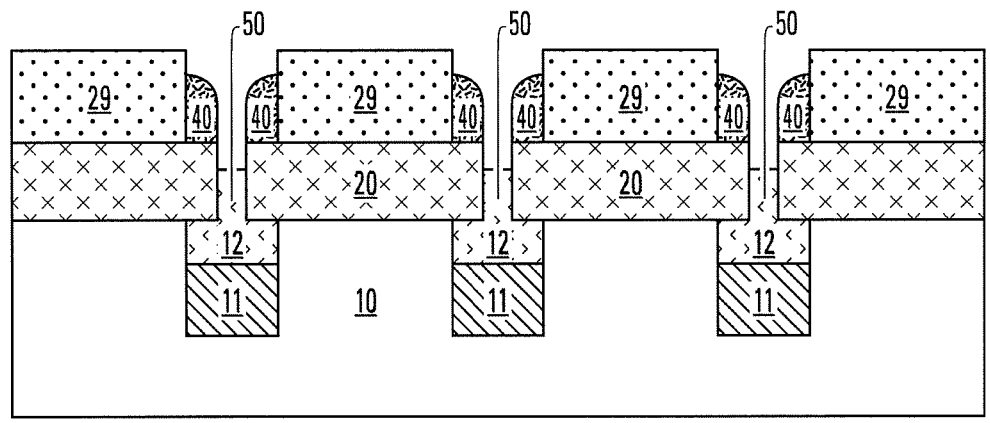
FIG. 19 is a cross-sectional view during the manufacturing process that shows the removal of excess heater material prior to the deposition of programmable resistive material, thereby reducing the amount of programmable resistive material to undergo heating.

FIG. 19 is a cross-sectional view during the manufacturing process that shows the removal of excess heater material prior to the deposition of programmable resistive material, thereby reducing the amount of programmable resistive material to undergo heating. Excess heater material TiN 49 is etched back, such as part of the material in the holes in the bottom silicon oxide layer 20, any material filling the space between the p-type silicon spacers 40, and any other excess material in the vias between n-type silicon 29 or covering the n-type silicon 29. The remaining heater material TiN 50 partly fills the holes in the bottom silicon oxide layer 20.

Figure 20:
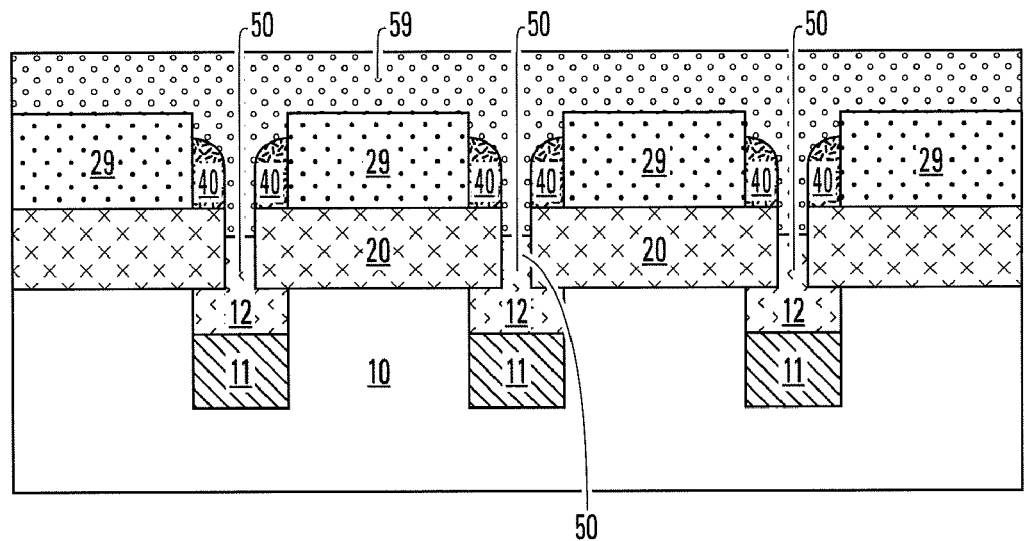
FIG. 20 is a cross-sectional view during the manufacturing process that shows deposition of programmable resistive material.

FIG. 20 is a cross-sectional view during the manufacturing process that shows deposition of programmable resistive material. Programmable resistive material 59 is deposited, filling the holes in the bottom silicon oxide layer 20, and filling the space between the p-type silicon spacers 40.

Figure 21:
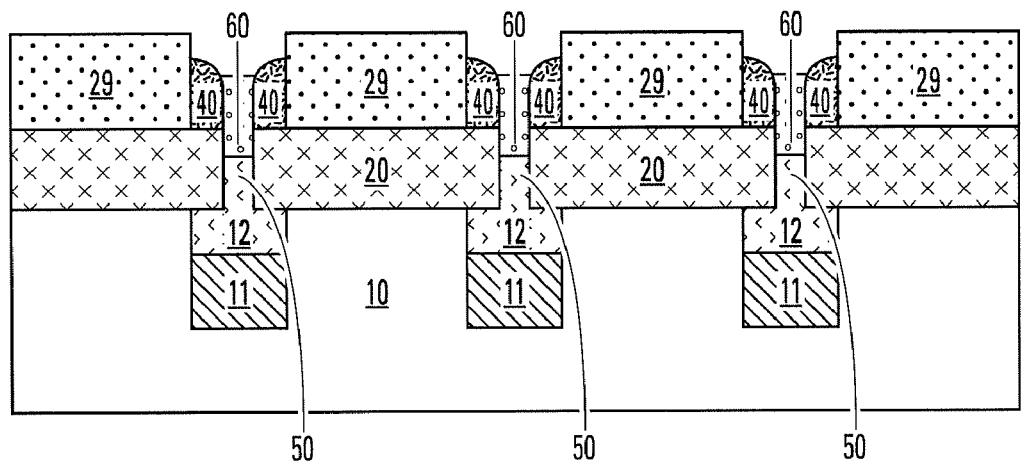
FIG. 21 is a cross-sectional view during the manufacturing process that shows the removal of excess programmable resistive material.

FIG. 21 is a cross-sectional view during the manufacturing process that shows the removal of excess programmable resistive material. Excess programmable resistive material 59 is etched back, leaving the programmable resistive material 60 in the gaps in the bottom silicon oxide layer 20, and partly in the space between the p-type silicon spacers 40. The programmable resistive material 60 has a sidewall surface connected to the interior surface of the p-type silicon spacers 40, and a bottom surface conductively coupled to the bit lines 11 and 12. The programmable resistive material 60 is physically separated from the n-type silicon layer 29 by p-type silicon spacers 40.

Figure 22:
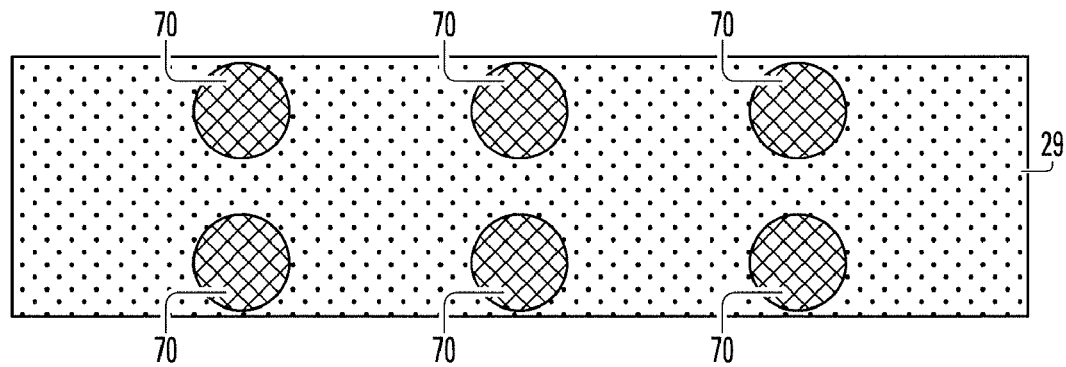
FIG. 22 is a top view, of the same step shown in FIG. 23, during the manufacturing process that shows oxide deposition to fill in the remaining volume of the vias, and chemical mechanical polishing of excess fill-in oxide.
Figure 23:
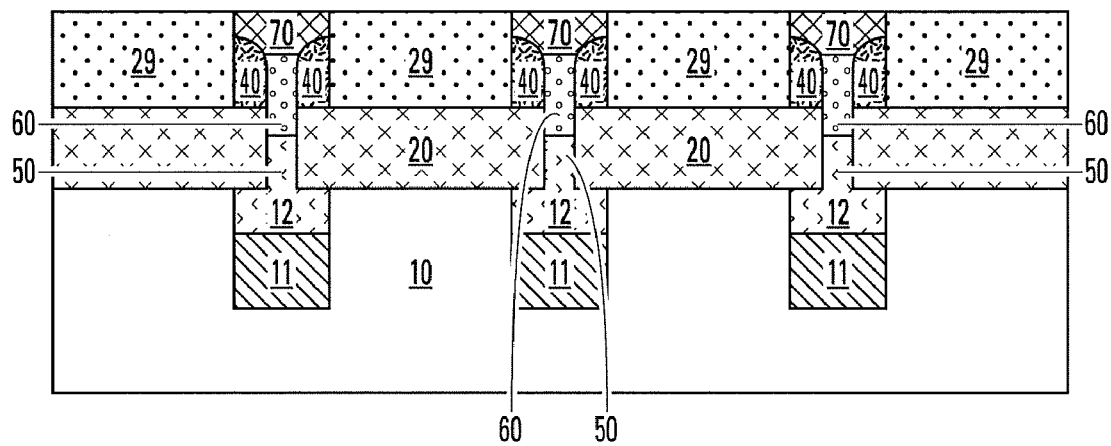
FIG. 23 is a cross-sectional view, of the same step shown in FIG. 22, during the manufacturing process that shows oxide deposition to fill in the remaining volume of the vias, and chemical mechanical polishing of excess fill-in oxide.

FIG. 22 is a top view, of the same step shown in FIG. 23, during the manufacturing process that shows oxide deposition to fill in the remaining volume of the vias, and chemical mechanical polishing of excess fill-in oxide. Oxide is formed to fill the remaining spaces between the p-type silicon spacers 40, and the remaining spaces between the n-type silicon 29. Excess oxide over the n-type silicon 29 is removed by chemical mechanical polishing. Oxide 70 remains, filling spaces between the p-type silicon spacers 40, and the spaces between the n-type silicon 29. The oxide results in the top surface of the programmable resistive material 60 not being used as a surface through which current passes. However, the relative smaller size of the top surface compared to the sidewall surface of the programmable resistive material 60 is illustrative of a greater current capacity.

FIG. 23 is a cross-sectional view, of the same step shown in FIG. 22, during the manufacturing process that shows oxide deposition to fill in the remaining volume of the vias, and chemical mechanical polishing of excess fill-in oxide.

Figure 24:
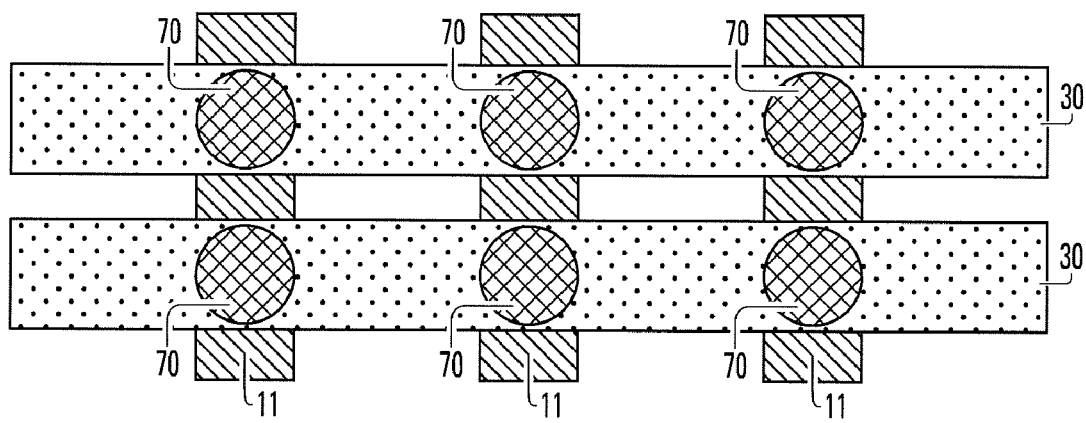
FIG. 24 is a top view, of the same step shown in FIG. 25, during the manufacturing process that shows the removal of excess n-type material to leave n-type material in word line shapes to access the memory cells.
Figure 25:
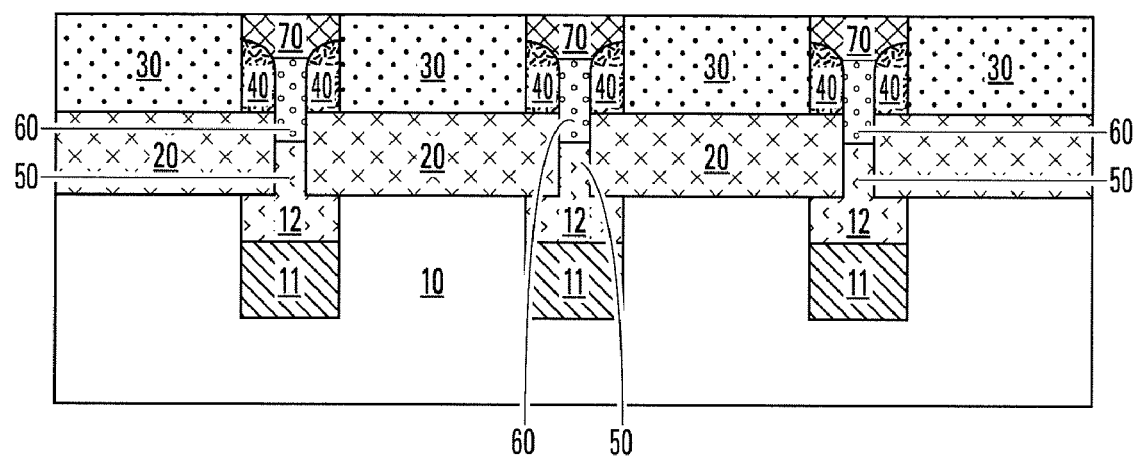
FIG. 25 is a cross-sectional view, of the same step shown in FIG. 24, during the manufacturing process that shows the removal of excess n-type material to leave n-type material in word line shapes to access the memory cells.

FIG. 24 is a top view, of the same step shown in FIG. 25, during the manufacturing process that shows the lithographic definition and removal (via e.g. reactive ion etching) of excess n-type material to leave n-type material in word line shapes to access the memory cells. Excess n-type silicon material 29 is removed, leaving word line-shaped n-type silicon material 30. Although covered by other layers, bit lines 11 are shown to illustrate both directions of accessing the memory cells.

FIG. 25 is a cross-sectional view, of the same step shown in FIG. 24, during the manufacturing process that shows the removal of excess n-type material to leave n-type material in word line shapes to access the memory cells.

Figure 26:
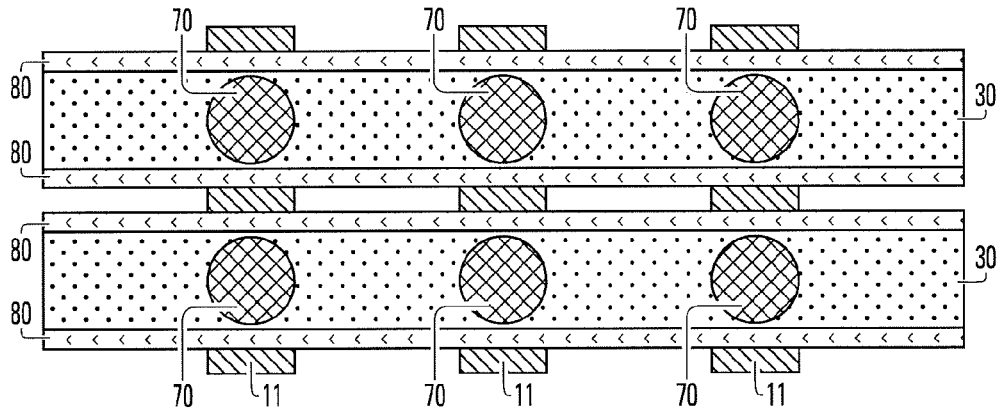
FIG. 26 is a top view during the manufacturing process that shows the formation of word lines by forming conductive word line spacers along the word line-shaped n-type material, thereby reducing the resistance sufficiently for practical word line operation.

FIG. 26 is a top view during the manufacturing process that shows the formation of word lines by forming conductive word line spacers along the word line-shaped n-type material, thereby reducing the resistance sufficiently for practical word line operation. Word line metal TiN 80 is formed alongside the word line-shaped n-type silicon 30, substantially reducing the resistance of the word line structure. The word lines are in parallel and collectively define a planar orientation. Also, each word line by itself defines a linear orientation. This planar orientation is parallel with the planar orientation defined by the bit lines. Both planar orientations are orthogonal to the diode junction orientation.

In response to a forward bias on a particular one of the diode structures (each including word line-shaped n-type silicon material 30 and a p-type silicon spacer 40), a driving current flows through: at least one of the conductive columns 11/12 conductively coupled to a programmable resistive element 60, the programmable resistive element 60 conductively connected to the particular one of the diode structures, the particular one of the diode structures (each including word line-shaped n-type silicon material 30 and a p-type silicon spacer 40), and then at least one of the conductive rows 80 conductively coupled to the particular one of the diode structures. In another embodiment where the p-type and n-type material of the diode structures is exchanged, the current path is reversed.

Figure 27:
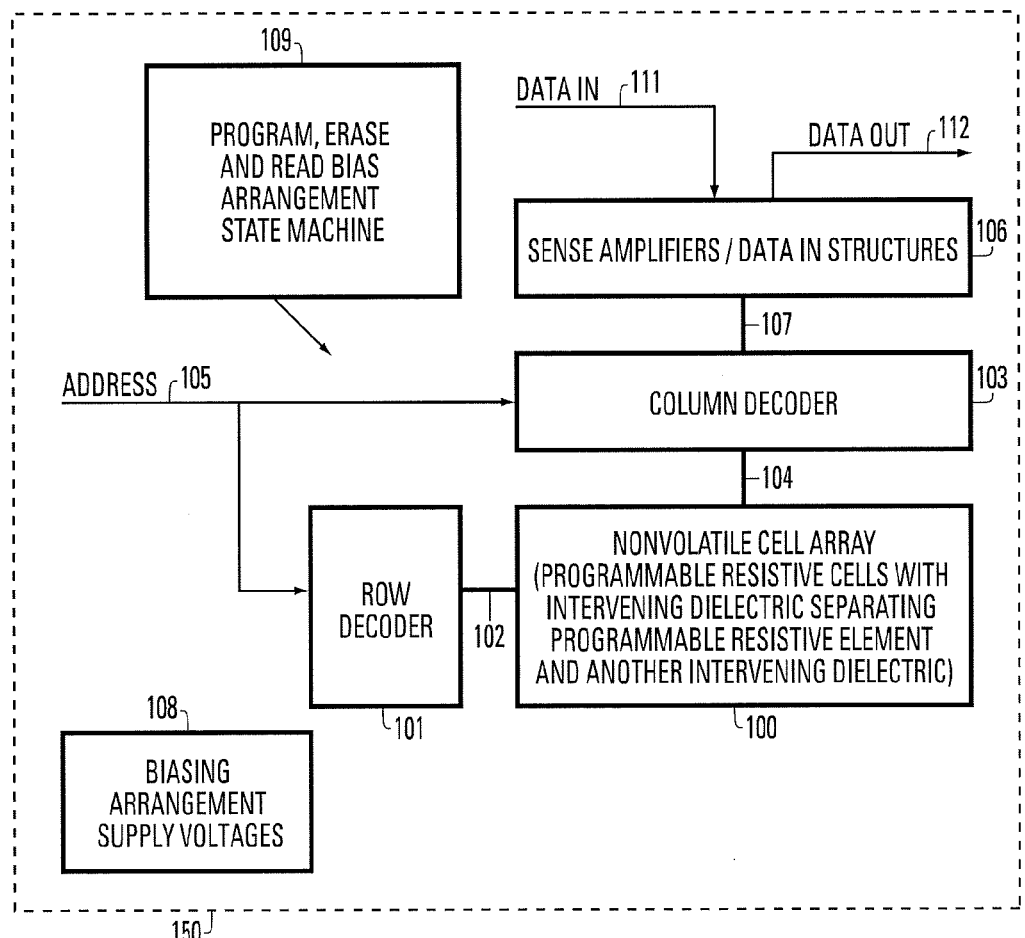
FIG. 27 is a block diagram of a nonvolatile memory integrated circuit, with an array of programmable resistive memory cells having a diode structure.

FIG. 27 is a block diagram of a nonvolatile memory integrated circuit, with an array of programmable resistive memory cells having a diode structure.

The integrated circuit 150 includes a memory array 100 implemented using memory cells with resistive elements on a semiconductor substrate. The programmable resistive cells are separated by semiconductor diode structures as described herein. A sample quantity of memory cells of the array 100 (such as on different sides of the array 100) has a size variation of the programmable resistive elements 60 less than a size variation of the diode first terminals 40, because of the highly controllable programmable resistive element sizes, as discussed in connection with FIG. 6.

Addresses are supplied on bus 105 to column decoder 103 and row decoder 101. Sense amplifiers and data-in structures in block 106 are coupled to the column decoder 103 via data bus 107. Data is supplied via the data-in line 111 from input/output ports on the integrated circuit 150, or from other data sources internal or external to the integrated circuit 150, to the data-in structures in block 106. Data is supplied via the data-out line 115 from the block 106 to input/output ports on the integrated circuit 150, or to other data destinations internal or external to the integrated circuit 150. The integrated circuit 150 may also include circuitry directed a mission function other than the nonvolatile storage with resistive elements (not shown). Bias arrangement state machine 109 controls the application of bias arrangement supply voltages.

In some embodiments, the bit lines and word lines correspond to the bit lines 104 leading to the column decoder 103 and to the word lines 102 leading to the row decoder 101.

Some embodiments the memory array 100 include millions of cells covers a relatively large area on a device, over which the lithographically formed vias will vary in size over a range $\Delta V$, where V represents the nominal size of the via. Therefore, if one samples a first memory cell in a first sector of the array, and compares that cell with a second memory cell in a second sector of the array, it is likely that the via used for formation of the memory element will differ by as much as $\Delta V$. However, the width of the surface of the bottom electrode in contact with the memory element, in embodiments of the present invention will vary by at most $2\Delta O$, where O represents the nominal size of the overhang characterizing the undercut process of FIG. 4.

For example, using a lithographic process having a 90 nm feature size, varying by 5% across the array, the width V of a memory element varies by about 4.5 nm across an array. The overhang dimension O determined by the undercut etch process or by the overhang growth process, may also vary across an array by 5%. In order to make a 40 nm CD, the overhang dimension O should be 20 nm. If the process creating the overhang results in a variation of 5%, then the overhang dimension O could vary by 1 nm on each side. This would result in a variation in CD of 2 nm for the nominally 40 nm hole across an array, or 5%. This 2 nm variation is substantially less than the variation in the lithographic dimension. In contrast, prior art sidewall spacer techniques that do not compensate for lithographic variations would result in a 4.5 nm variation across the array for the nominally 40 nm via, or 11.25%. The self-converging process described herein substantially narrows the distribution of CD across the array.

Thus, for an illustrative example in which the dimension V is assumed to vary across the specified range of about 5% for nominally V=90 nm and the dimension CD is assumed to vary across a range of about 5% for nominally CD=40 nm, the first cell may have a width of dimension V of about 92 nm and a dimension CD of about 39 nm, while the second cell may have a width of dimension V of about 88 nm, and a dimension CD of about 41 nm. Thus, a structure results in which the width of the memory element in the first cell as measured varies from width of the memory element in the second cell by 4/92, or 4.3% of the width V, in the example illustrated. However, the width of the critical dimension in the first cell varies from that in the second cell by 2/92, or 2.2% of the width V. Therefore the critical dimensions of the sampled memory cells vary by less than the variations in the width of the memory elements in a way not possible in the prior art.

Terms describe positions of layers with respect to each other are relative unless otherwise specified. For example, a layer "covers" another layer or is "above" another layer, even in the presence of a layer (e.g., between the covering layer and the covered layer, or between the "above" layer and the "below" layer. A layer is "between" two other layers, regardless of any layers on either side.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. An integrated circuit with an array of nonvolatile memory cells, comprising:
   conductive columns conductively coupled to the nonvolatile memory cells, the conductive columns arranged in parallel and defining a first planar orientation;
   conductive rows conductively coupled to the nonvolatile memory cells, the conductive rows arranged in parallel and defining a second planar orientation parallel with the first planar orientation;
   a nonconductive layer separating the conductive columns from diode structures;
   the diode structures connecting programmable resistive elements with the conductive rows, each including:
      a first terminal having an exterior surface, and an interior surface connected to at least one of the programmable resistive elements;
      a second terminal in contact with a junction area on the exterior surface of the first terminal providing a diode junction oriented orthogonal to the first and second planar orientations; and
   the programmable resistive elements each having:
      a sidewall surface connected to the interior surface of the first terminal of at least one of the diode structures; and
      a bottom surface conductively coupled to at least one of the conductive columns.

2. The integrated circuit of claim 1, wherein the first terminals of the diode structures physically separate the programmable resistive elements and the second terminals of the diode structures.

3. The integrated circuit of claim 1, wherein the diode structures are arranged, so that in response to a forward bias on a particular one of the diode structures, a driving current flows through: at least one of the conductive columns, a programmable resistive element of the programmable resistive elements conductively coupled to said at least one of the conductive columns, the particular one of the diode structures conductively connected to said programmable resistive element, and at least one of the conductive rows conductively coupled to the particular one of the diode structures.

4. The integrated circuit of claim 1, wherein the conductive rows include conductive spacers adjacent to the second terminals.

5. The integrated circuit of claim 1, wherein the conductive rows include a self-aligned silicide over the second terminals of the diode structures.

6. The integrated circuit of claim 1, wherein the diode structures include a sample quantity of diode structures, the programmable resistive elements of the sample quantity of diode structures have a first size variation across the sample quantity of diode structures, the first terminals of the sample quantity of diode structures have a second size variation across the sample quantity of diode structures, and the first size variation is less than the second size variation.

7. A method of forming an integrated circuit with nonvolatile memory cells, comprising:
   forming conductive columns conductively coupled to the nonvolatile memory cells, the conductive columns arranged in parallel and defining a first planar orientation;
   forming conductive rows conductively coupled to the nonvolatile memory cells, the conductive rows arranged in parallel and defining a second planar orientation parallel with the first planar orientation;
   forming a nonconductive layer separating the conductive columns from diode structures;
   forming the diode structures to connect programmable resistive elements with conductive rows, including:
      forming first terminals of the diode structures each having an exterior surface and an interior surface to connect to at least one of the programmable resistive elements;
      forming second terminals of the diode structures in contact with a junction area on the exterior surface of the first terminal providing a diode junction oriented orthogonal to the first and second planar orientations; and
   forming the programmable resistive elements each having:
      a sidewall surface connected to the interior surface of one of the first terminals of one of the diode structures; and
      a bottom surface conductively coupled to at least one of the conductive columns.

8. The method of claim 7, wherein the diode structures are arranged, so that in response to a forward bias on a particular one of the diode structures, a driving current flows through: at least one of the conductive columns, a programmable resistive element of the programmable resistive elements conductively coupled to said at least one of the conductive columns, the particular one of the diode structures conductively connected to said programmable resistive element, and at least one of the conductive rows conductively coupled to the particular one of the diode structures.

9. The method of claim 7, wherein said forming the first terminals occurs after said forming the second terminals, and wherein said forming the second terminals further includes:
   forming a layer of the second terminals over the conductive columns;
      forming an oxide layer over the layer of the second terminals;
      forming cavities in the layer of the second terminals and the oxide layer by removing material from the layer of the second terminals and the oxide layer, whereby said forming the first terminals and said forming the programmable resistive elements occurs at least partly in the cavities of the layer of the second terminals and the oxide layer; and
      forming an undercut in the cavities of the layer of the second terminals and the oxide layer, by laterally removing more material from the layer of the second terminals than from the oxide layer.

10. The method of claim 7, wherein said forming the first terminals further includes:
   forming a layer of the first terminals; and
   removing part of the layer of the first terminals to leave element cavities in which to perform said forming programmable resistive elements.

11. The method of claim 7, wherein said forming the conductive rows further includes forming conductive spacers adjacent to the second terminals.

12. The method of claim 7, wherein said forming the conductive rows further includes forming a self-aligned silicide over the second terminals of the diode structures.

13. The method of claim 7, wherein the diode structures include a sample quantity of diode structures, the programmable resistive elements of the sample quantity of diode structures have a first size variation across the sample quantity of diode structures, the first terminals of the sample quantity of diode structures have a second size variation across the sample quantity of diode structures, and the first size variation is less than the second size variation.

14. An integrated circuit with an array of nonvolatile memory cells, comprising:
   conductive columns conductively coupled to the nonvolatile memory cells;
   a nonconductive layer separating the conductive columns from diode structures;
   the diode structures surrounding programmable resistive elements, the diode structures each including:
      a first terminal having an annular shape with an exterior surface, and an interior surface surrounding at least one of the programmable resistive elements; and
      a second terminal in contact with the exterior surface of the first terminal;
   the programmable resistive elements surrounded by the diode structures, the programmable resistive elements each having:
      a sidewall surface surrounded by the interior surface of the first terminal of at least one of the diode structures, and
      a bottom surface conductively coupled to at least one of the conductive columns; and
   conductive rows conductively coupled to the second terminals of the diode structures.

15. The integrated circuit of claim 14, wherein the first terminals of the diode structures physically separate the programmable resistive elements and the second terminals of the diode structures.

16. The integrated circuit of claim 14, wherein the diode structures are arranged, so that in response to a forward bias on a particular one of the diode structures, a driving current flows through: at least one of the conductive columns, a programmable resistive element of the programmable resistive elements conductively coupled to said at least one of the conductive columns, the particular one of the diode structures conductively connected to said programmable resistive element, and at least one of the conductive rows conductively coupled to the particular one of the diode structures.

17. The integrated circuit of claim 14, wherein the conductive rows include a self-aligned silicide over the second terminals of the diode structures.

18. The integrated circuit of claim 14, wherein the conductive rows include conductive spacers adjacent to the second terminals.

19. The integrated circuit of claim 14, wherein the diode structures include a sample quantity of diode structures, the programmable resistive elements of the sample quantity of diode structures have a first size variation across the sample quantity of diode structures, the first terminals of the sample quantity of diode structures have a second size variation across the sample quantity of diode structures, and the first size variation is less than the second size variation.

20. A method of forming an integrated circuit with non-volatile memory cells, comprising:
 forming conductive columns conductively coupled to the nonvolatile memory cells;
 forming a nonconductive layer separating the conductive columns from diode structures;
 forming the diode structures to surround programmable resistive elements, including:
  forming first terminals of the diode structures, the first terminals each having an annular shape with an exterior surface, and an interior surface to surround the programmable resistive elements; and
  forming second terminals of the diode structures, the second terminals in contact with the exterior surfaces of the first terminals;
 forming the programmable resistive elements surrounded by the diode structures, the programmable resistive elements each having:
  a sidewall surface surrounded by the interior surface of the first terminal of one of the diode structures, and
  a bottom surface conductively coupled to at least one of the conductive columns; and
 forming conductive rows conductively coupled to the second terminals of the diode structures.

21. The method of claim 20, wherein said forming the first terminals occurs after said forming the second terminals, and wherein said forming the second terminals further includes:
 forming a layer of the second terminals over the conductive columns;
 forming an oxide layer over the layer of the second terminals;
 forming cavities in the layer of the second terminals and the oxide layer by removing material from the layer of the second terminals and the oxide layer, whereby said forming the first terminals and said forming the programmable resistive elements occurs at least partly in the cavities of the layer of the second terminals and the oxide layer; and
 forming an undercut in the cavities of the layer of the second terminals and the oxide layer, by laterally removing more material from the layer of the second terminals than from the oxide layer.

22. The method of claim 20, wherein said forming the first terminals further includes:
 forming a layer of the first terminals; and
 removing part of the layer of the first terminals to leave element cavities in which to perform said forming programmable resistive elements.

23. The method of claim 20, wherein said forming the conductive rows includes:
 forming a self-aligned silicide over the second terminals of the diode structures.

24. The method of claim 20, wherein said forming the conductive rows includes:
 forming conductive spacers adjacent to the second terminals.

25. The method of claim 20, wherein the diode structures include a sample quantity of diode structures, the programmable resistive elements of the sample quantity of diode structures have a first size variation across the sample quantity of diode structures, the first terminals of the sample quantity of diode structures have a second size variation across the sample quantity of diode structures, and the first size variation is less than the second size variation.

* * * * *